(12) United States Patent
Vinciarelli et al.

(10) Patent No.: US 11,876,520 B1
(45) Date of Patent: Jan. 16, 2024

(54) METHOD AND APPARATUS FOR DELIVERING POWER TO SEMICONDUCTORS

(71) Applicant: Vicor Corporation, Andover, MA (US)

(72) Inventors: Patrizio Vinciarelli, Boston, MA (US); Andrew T. D'Amico, Beverly Hills, CA (US)

(73) Assignee: Vicor Corporation, Andover, MA (US)

( * ) Notice: Subject to any disclaimer, the term of this patent is extended or adjusted under 35 U.S.C. 154(b) by 158 days.

(21) Appl. No.: 17/390,285

(22) Filed: Jul. 30, 2021

Related U.S. Application Data

(60) Continuation of application No. 16/858,416, filed on Apr. 24, 2020, now Pat. No. 11,101,795, which is a division of application No. 16/046,882, filed on Jul. 26, 2018, now Pat. No. 10,998,903, which is a continuation of application No. 15/091,346, filed on Apr. 5, 2016, now Pat. No. 10,158,357.

(51) Int. Cl.
  *H03K 5/08* (2006.01)
  *H03K 17/691* (2006.01)
  *H02M 3/335* (2006.01)
  *H02J 3/00* (2006.01)

(52) U.S. Cl.
  CPC ............. *H03K 5/08* (2013.01); *H02J 3/00* (2013.01); *H02M 3/33576* (2013.01); *H03K 17/691* (2013.01)

(58) Field of Classification Search
  None
  See application file for complete search history.

(56) References Cited

U.S. PATENT DOCUMENTS

| 3,409,805 A | 11/1968 | Whippl |
| 3,846,741 A | 11/1974 | Kunkle et al. |

(Continued)

FOREIGN PATENT DOCUMENTS

| EP | 0715322 | 4/1998 |
| EP | 2863531 | 4/2015 |

(Continued)

OTHER PUBLICATIONS

U.S. Appl. No. 14/731,287, filed Jun. 4, 2015, Vinciarelli et al.

(Continued)

*Primary Examiner* — Cassandra F Cox
(74) *Attorney, Agent, or Firm* — Fish & Richardson P.C.

(57) ABSTRACT

A semiconductor package includes a VLSI semiconductor die and one or more output circuits connected to supply power to the die mounted to a package substrate. The output circuit(s), which include a transformer and rectification circuitry, provide current multiplication at an essentially fixed conversion ratio, K, in the semiconductor package, receiving AC power at a relatively high voltage and delivering DC power at a relatively low voltage to the die. The output circuits may be connected in series or parallel as needed. A driver circuit may be provided outside the semiconductor package for receiving power from a source and driving the transformer in the output circuit(s), preferably with sinusoidal currents. The driver circuit may drive a plurality of output circuits. The semiconductor package may require far fewer interface connections for supplying power to the die.

71 Claims, 21 Drawing Sheets

(56) References Cited

U.S. PATENT DOCUMENTS

| | | |
|---|---|---|
| 4,211,603 A | 7/1980 | Reed |
| 4,223,970 A | 9/1980 | Walter |
| 4,230,385 A | 10/1980 | Ammon et al. |
| 4,326,765 A | 4/1982 | Brancaleone |
| 4,394,711 A | 7/1983 | Conley |
| 4,526,429 A | 7/1985 | Kirkman |
| RE32,212 E | 7/1986 | Walter et al. |
| 4,742,477 A | 5/1988 | Phillips et al. |
| 4,917,526 A | 4/1990 | Paterson |
| 5,027,255 A | 6/1991 | Zeitlin |
| 5,168,432 A | 12/1992 | Murphy et al. |
| 5,321,351 A | 6/1994 | Swart et al. |
| 5,408,189 A | 4/1995 | Swart et al. |
| 5,438,294 A | 8/1995 | Smith |
| 5,471,366 A | 11/1995 | Ozawa |
| 5,481,436 A | 1/1996 | Werther |
| 5,728,600 A | 3/1998 | Vinciarelli et al. |
| RE36,442 E | 12/1999 | Kardos |
| 6,031,253 A | 2/2000 | Kobayashi |
| 6,031,743 A | 2/2000 | Carpenter et al. |
| 6,035,261 A | 3/2000 | Carpenter et al. |
| 6,049,258 A | 4/2000 | Fawal |
| 6,073,339 A | 6/2000 | Levin |
| 6,110,213 A | 8/2000 | Vinciarelli et al. |
| 6,116,916 A | 9/2000 | Kasai |
| 6,118,186 A | 9/2000 | Scott et al. |
| 6,147,876 A | 11/2000 | Yamaguchi |
| 6,184,585 B1 | 2/2001 | Martinez et al. |
| 6,229,216 B1 | 5/2001 | Ma et al. |
| 6,230,403 B1 | 5/2001 | Skoolicas et al. |
| 6,275,958 B1 | 8/2001 | Carpenter et al. |
| 6,300,749 B1 | 10/2001 | Castelli et al. |
| 6,391,685 B1 | 5/2002 | Hikita et al. |
| 6,403,009 B1 | 6/2002 | Saxelby, Jr. et al. |
| 6,421,262 B1 | 7/2002 | Saxelby et al. |
| 6,466,458 B2 | 10/2002 | Zhang et al. |
| 6,603,292 B1 | 8/2003 | Schouten et al. |
| 6,646,886 B1 | 11/2003 | Popovich et al. |
| 6,700,361 B2 | 3/2004 | Gregorius |
| 6,788,033 B2 | 9/2004 | Vinciarelli |
| 6,838,754 B2 | 1/2005 | Kim |
| 6,847,853 B1 | 1/2005 | Vinciarelli et al. |
| 6,911,848 B2 | 6/2005 | Vinciarelli |
| 6,930,893 B2 | 8/2005 | Vinciarelli |
| 6,934,166 B2 | 8/2005 | Vinciarelli |
| 6,940,013 B2 | 9/2005 | Vinciarelli et al. |
| 6,969,909 B2 | 11/2005 | Briere |
| 6,975,098 B2 | 12/2005 | Vinciarelli |
| 6,984,965 B2 | 1/2006 | Vinciarelli |
| 6,985,341 B2 | 1/2006 | Vinciarelli et al. |
| 7,015,587 B1 | 3/2006 | Poddar |
| 7,030,469 B2 | 4/2006 | Mahadevan et al. |
| 7,145,786 B2 | 12/2006 | Vinciarelli |
| 7,187,263 B2 | 3/2007 | Vinciarelli et al. |
| 7,198,987 B1 | 4/2007 | Warren et al. |
| 7,245,509 B1 | 7/2007 | Chan et al. |
| 7,268,425 B2 | 9/2007 | Mallik et al. |
| 7,294,007 B1 | 11/2007 | Lawlyes |
| 7,298,038 B2 | 11/2007 | Filoteo et al. |
| RE40,072 E | 2/2008 | Prager et al. |
| 7,361,844 B2 | 4/2008 | Vinciarelli et al. |
| 7,494,843 B1 | 2/2009 | Lin et al. |
| 7,521,909 B2 | 4/2009 | Dow et al. |
| 7,561,446 B1 | 7/2009 | Vinciarelli |
| 7,701,051 B2 | 4/2010 | Bayerer et al. |
| 7,767,494 B2 | 8/2010 | Sasaki et al. |
| 7,768,807 B2 | 8/2010 | Chen et al. |
| 7,952,879 B1 | 5/2011 | Vinciarelli |
| 8,138,584 B2 | 3/2012 | Wang |
| 8,232,783 B2 | 7/2012 | Yanagawa |
| 8,240,035 B2 | 8/2012 | Nishikawa |
| 8,263,434 B2 | 9/2012 | Pagaila et al. |
| 8,288,846 B2 | 10/2012 | Narendra et al. |
| 8,344,842 B1 * | 1/2013 | Luzanov ............ H01F 41/02 |
| | | 336/192 |
| 8,427,269 B1 | 4/2013 | Vinciarelli et al. |
| 8,582,333 B2 | 11/2013 | Oraw et al. |
| 8,896,111 B2 | 11/2014 | Vinciarelli |
| 8,966,747 B2 | 3/2015 | Vinciarelli et al. |
| 9,087,656 B1 | 7/2015 | Vinciarelli |
| 9,107,290 B1 | 8/2015 | Chen |
| 9,112,422 B1 | 8/2015 | Vinciarelli |
| 9,166,481 B1 | 10/2015 | Vinciarelli et al. |
| 9,402,319 B2 | 7/2016 | Vinciarelli et al. |
| 9,439,297 B2 | 9/2016 | Vinciarelli |
| 9,516,761 B1 | 12/2016 | Vinciarelli et al. |
| 9,571,084 B1 | 2/2017 | Vinciarelli et al. |
| 9,584,026 B1 | 2/2017 | Vinciarelli et al. |
| 9,660,537 B1 | 5/2017 | Vinciarelli |
| 9,765,750 B2 | 9/2017 | Ferguson et al. |
| 9,936,580 B1 | 4/2018 | Vinciarelli et al. |
| 10,014,798 B1 | 7/2018 | Vinciarelli et al. |
| 10,020,752 B1 | 7/2018 | Vinciarelli et al. |
| 10,158,357 B1 | 12/2018 | Vinciarelli et al. |
| 10,231,333 B1 | 3/2019 | Liu et al. |
| 10,264,664 B1 | 4/2019 | Vinciarelli et al. |
| 10,277,105 B1 | 4/2019 | Vinciarelli et al. |
| 10,390,437 B2 | 8/2019 | Kudou et al. |
| 10,512,182 B2 | 12/2019 | Suzuki |
| 10,537,015 B1 | 1/2020 | Vinciarelli |
| 10,701,828 B1 | 6/2020 | Vinciarelli |
| 10,757,816 B2 | 8/2020 | Vinciarelli et al. |
| 10,791,645 B1 | 9/2020 | Vinciarelli |
| 10,903,734 B1 * | 1/2021 | Vinciarelli ............ H05K 1/0298 |
| 11,336,167 B1 * | 5/2022 | Vinciarelli ............ H05K 1/0298 |
| 2001/0018285 A1 | 8/2001 | Mizumura |
| 2001/0018286 A1 | 8/2001 | Mizumura |
| 2001/0023980 A1 | 9/2001 | Ohmori |
| 2001/0032388 A1 | 10/2001 | Morris |
| 2003/0030326 A1 | 2/2003 | Shenai |
| 2003/0058628 A1 | 3/2003 | Boylan |
| 2003/0087538 A1 | 5/2003 | Ueno |
| 2003/0162434 A1 | 8/2003 | Kamiya |
| 2003/0168499 A1 | 9/2003 | Tanabe et al. |
| 2003/0227280 A1 | 12/2003 | Vinciarelli et al. |
| 2004/0100778 A1 | 5/2004 | Vinciarelli et al. |
| 2004/0157410 A1 | 8/2004 | Yamaguchi |
| 2004/0207089 A1 | 10/2004 | Masuda |
| 2004/0251554 A1 | 12/2004 | Masuda |
| 2005/0048692 A1 | 3/2005 | Hanada et al. |
| 2005/0167814 A1 | 8/2005 | Beroz et al. |
| 2005/0184381 A1 | 8/2005 | Asahi |
| 2006/0127652 A1 | 6/2006 | Kanaya et al. |
| 2006/0133041 A1 | 6/2006 | Belady |
| 2006/0133042 A1 | 6/2006 | Belady |
| 2006/0180346 A1 | 8/2006 | Knight et al. |
| 2006/0272150 A1 | 12/2006 | Eguchi et al. |
| 2006/0291265 A1 | 12/2006 | Schrom et al. |
| 2007/0158799 A1 | 7/2007 | Chiu |
| 2007/0241440 A1 | 10/2007 | Hoang et al. |
| 2007/0297198 A1 | 12/2007 | Chang |
| 2008/0078572 A1 | 4/2008 | Watanabe et al. |
| 2008/0116589 A1 | 5/2008 | Li et al. |
| 2008/0285312 A1 | 11/2008 | Fu et al. |
| 2009/0016083 A1 | 1/2009 | Soldano et al. |
| 2009/0122578 A1 | 5/2009 | Beltran |
| 2009/0140394 A1 | 6/2009 | Bathan et al. |
| 2009/0251873 A1 | 10/2009 | Chenq |
| 2009/0321956 A1 | 12/2009 | Sasaki et al. |
| 2009/0321957 A1 | 12/2009 | Sasaki et al. |
| 2009/0325345 A1 | 12/2009 | Sasaki et al. |
| 2010/0072604 A1 | 3/2010 | Komatsu et al. |
| 2010/0172116 A1 | 7/2010 | Yorita |
| 2010/0246152 A1 | 9/2010 | Lin et al. |
| 2012/0287582 A1 | 11/2012 | Vinciarelli et al. |
| 2013/0030534 A1 | 1/2013 | DeLurio et al. |
| 2013/0069608 A1 | 3/2013 | Gakhar et al. |
| 2013/0083495 A1 | 4/2013 | Moon et al. |
| 2014/0152350 A1 | 6/2014 | Ikriannikov et al. |
| 2014/0218155 A1 | 8/2014 | Akre |
| 2014/0355218 A1 | 12/2014 | Vinciarelli et al. |
| 2015/0181719 A1 | 6/2015 | Vinciarelli et al. |
| 2015/0181727 A1 | 6/2015 | Vinciarelli |
| 2015/0188407 A1 | 7/2015 | Golder et al. |

(56) References Cited

U.S. PATENT DOCUMENTS

| | | | |
|---|---|---|---|
| 2016/0128215 | A1 | 5/2016 | Kanzaki et al. |
| 2016/0173000 | A1 | 6/2016 | Lu et al. |
| 2016/0302312 | A1 | 10/2016 | Vinciarelli et al. |
| 2017/0013748 | A1 | 1/2017 | Saji et al. |
| 2017/0115144 | A1 | 4/2017 | Watanabe et al. |
| 2017/0336584 | A1 | 11/2017 | Ariga et al. |
| 2019/0013140 | A1 | 1/2019 | Rainer |
| 2019/0080931 | A1 | 3/2019 | Ito et al. |
| 2020/0253060 | A1 | 8/2020 | Vinciarelli et al. |

FOREIGN PATENT DOCUMENTS

| | | |
|---|---|---|
| JP | H02 280666 | 11/1990 |
| JP | H04 293293 | 10/1992 |
| WO | WO 1995/027308 | 10/1995 |
| WO | WO 2012/155036 | 11/2012 |

OTHER PUBLICATIONS

U.S. Appl. No. 14/822,561, filed Aug. 10, 2015, Vinciarelli.
U.S. Appl. No. 14/874,054, filed Oct. 2, 2015, Vinciarelli.
"Intel, Voltage Regulator Module (VRM) and Enterprise Voltage Regulator-Down (EVRD) 11.1 Design Guidelines", Sep. 2009, retrieved from URL <https://www.intel.it/content/dam/doc/design-guide/voltage-regulator-module-enterprise-voltage-regulator-down-11-1-guidelines.pdf>.
"Schock Power, technical data, DC-DC Converter SDC100-1.1HC, 100A 1.1V" 2005.
Amendment after Allowance Pursuant to 37 C.F.R. §1.312 in U.S. Appl. No. 13/044,063, dated Mar. 3, 2015, 17 pages.
AN2738, Application Note AN2738, "L6390 half-bridge gate driver," STMicroelectronics, Aug. 2009.
AND8311/D (Understanding the LLC Structure in Resonant Applications, Christophe Basso, ON Semiconductor, Jan., 2008) (Year: 2008).
Braun et al. "Opportunities of Wafer Level Embedded Technologies for MEMS Devices"; SEMI MEMS Tech Seminar; (possibly published on Sep. 26, 2013); 22 pages.
"Brown (Point of Load Converters—The Topologies, Converters, and Switching Devices Required for Efficient Conversion."
Jess Brown, Vishay Siliconix, Presented at PCIM Conference, May 2002) (Year: 2002).
Burton et al., "FIVR—Fully Integrated Voltage Regulators on 4th Generation Intel® Core™ SoCs," In Applied Power Electronics Conference and Exposition (APEC), 2014 Twenty-Ninth Annual IEEE, Mar. 16, 2014, 432-439.
Cao et al., "A Family of Zero Current Switching Switched-Capacitor DC-DC converters," Applied Power Electronics Conference and Exposition (APEC) ,Mar. 18, 2010 Twenty-Fifth Annual IEEE, pp. 1365-1372.
Cao et al., "Zero-Current-Switching Multilevel Modular Switched-Capacitor DC-DC Converter" IEEE Transactions on Industry Applications, Sep. 2010, 46(6):2536-2544.
DiBene II et al., "A 400 Amp Fully Integrated Silicon Voltage Regulator with in-die Magnetically Coupled Embedded Inductors," retrieved from http://www.psma.com/sites/default/files/uploads/tech-forums-nanotechnology/resources/400a-fully-integrated-silicon-voltage-regulator.pdf, retrieved on Aug. 3, 2016, 25 pages.
EP European Office Action in European Application No. 16173089.0, dated Apr. 10, 2017, 2 pages.
EP Extended Search Report in European Application No. 16173089.0, dated Feb. 14, 2017, 8 pages.
Ideas for attaching / connecting / stacking one PCB onto another with no gap; http://electronics.stackexchange.com/questions/45733/ideas-for -attaching-connecting-stacking-one-PCB-onto-another-with-no-gap; accessed on Jun. 3, 2015; 5 pages.
ISL6210, Datasheet ISL6210, "Dual Synchronous Rectified MOSFET Drivers," Intersil Americas Inc., Dec. 2008.
Miller, "12V PowerStage in Embedded Die System-in-Package," APEC 2015, 33 pages.
Okudaira et al., "A New Quasi-Resonant Inverter With Two-way Short-circuit Switch Across A Resonant Capacitor," Power Conversion Conference Apr. 2002, 3:1496-1501.
Oraw et al., "Load Adaptive, High Efficiency, Switched Capacitor Intermediate Bus Converter," Telecommunications Energy Conference, IEEE Sep. 30-Oct. 4, 2007, pp. 628-635.
PCT International Search Report and Written Opinion, PCT/US2012/37495, dated May 6, 2013, 18 pages.
Seeman et al., "Analysis and optimization of switched-capacitor dc-dc converters," Power Electronics, IEEE Transactions, Mar. 2008 23:841-851.
TND359 ("High-Efficiency 255W ATX Power Supply Reference Design Documentation Package," ON Semiconductor, Jan. 2009) (Year: 2009).
USPTO Notice of Allowance in U.S. Appl. No. 13/044,063, dated Feb. 20, 2015, 15 pages.
USPTO Notice of Allowance in U.S. Appl. No. 13/044,063, dated Jun. 5, 2015, 11 pages.
USPTO Notice of Allowance in U.S. Appl. No. 14/682,187, dated Jan. 17, 2017, 22 pages.
USPTO Notice of Allowance in U.S. Appl. No. 15/091,346, dated Aug. 13, 2018, 8 pages.
USPTO Notice of Allowance in U.S. Appl. No. 15/091,346, dated May 21, 2018, 9 pages.
USPTO Notice of Allowance in U.S. Appl. No. 15/616,288, dated Dec. 11, 2018, 9 pages.
USPTO Office Action in U.S. Appl. No. 13/044,063, dated May 23, 2014, 24 pages.
USPTO Office Action in U.S. Appl. No. 13/105,696, dated Sep. 25, 2013, 8 pages.
USPTO Office Action in U.S. Appl. No. 14/116,642, dated Feb. 9, 2016, 15 pages.
USPTO Office Action in U.S. Appl. No. 14/635,420, dated Oct. 22, 2015, 6 pages.
USPTO Reply to Action dated May 23, 2014 in U.S. Appl. No. 13/044,063, dated Oct. 24, 2014, 39 pages.
USPTO Supplemental Notice of Allowability in U.S. Appl. No. 13/044,063, dated Apr. 20, 2015, 5 pages.
Watson, "New Techniques in the Design of Distributed Power System," Dissertation, 1998, 32 pages.
Yeung et al., "Generalised analysis of switched-capacitor step-down quasi-resonant converter," Electronics Letters, Aug. 2002, 38:263-264.
Yeung et al., "Zero-current switching switched-capacitor quasiresonant step-down converter," Electric Power Applications, IEE Proceedings, Mar. 2002, 149(2):111-121.

\* cited by examiner

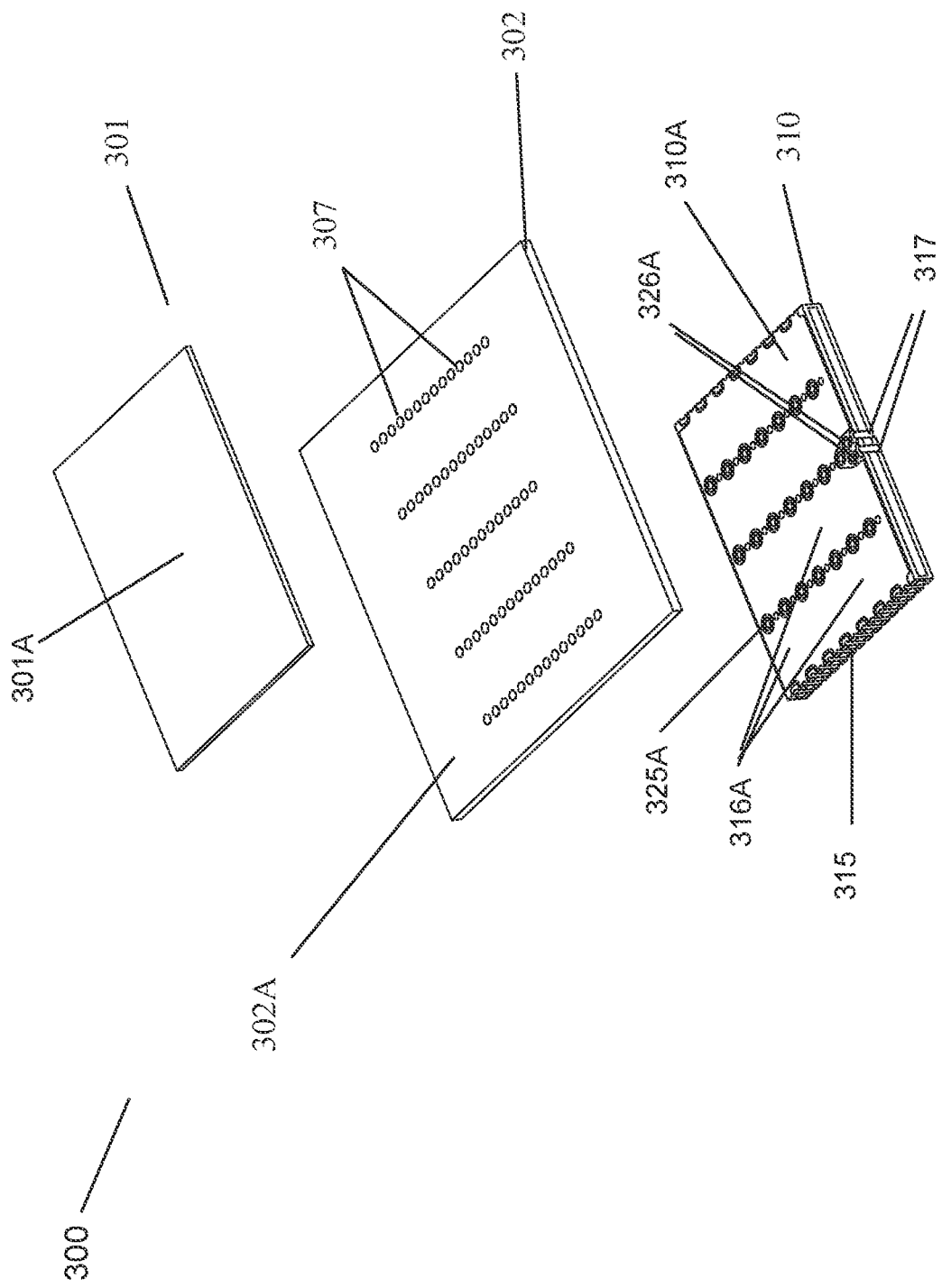

METHOD AND APPARATUS FOR DELIVERING POWER TO SEMICONDUCTORS

CROSS-REFERENCE TO RELATED APPLICATIONS

This application is a continuation application of U.S. patent application Ser. No. 16/858,416, filed on Apr. 24, 2020, which is a divisional application of U.S. patent application Ser. No. 16/046,882, filed on Jul. 26, 2018, now U.S. Pat. No. 10,998,903, which is a continuation application of U.S. patent application Ser. No. 15/091,346, filed on Apr. 5, 2016, now U.S. Pat. No. 10,158,357. The entire contents of the above applications are hereby incorporated by reference.

FIELD OF THE INVENTION

This invention relates to the field of switching power supplies and more particularly to power converters that supply power to large semiconductor devices such as processors and ASICs.

BACKGROUND

Many large scale semiconductors require high current, e.g. 100 A or more, at low voltages, e.g. 1V, or less, dissipate large amounts of power, challenging packaging technologies to accommodate power, thermal, and signal demands. Resonant switching power converters may be used as fixed ratio current multipliers in power conversion systems to provide high current at a low voltage.

SUMMARY

In one aspect, in general, a method of supplying power received from an input source at an input voltage to circuitry on one or more semiconductor chips mounted in a semiconductor package at a DC output voltage is provided. The method includes providing a driver circuit for deployment outside the semiconductor package having an input for receiving power from the source, circuitry adapted to drive a transformer, and a driver output; providing one or more output circuits for deployment in the semiconductor package, each output circuit including a printed circuit board, a power transformer including a first winding and a second winding, an input connected to the first winding for receiving AC power from the driver output, a rectification circuit connected to the second winding for rectifying power received from the transformer, and an output connected to the rectification circuit for supplying DC power to the one or more semiconductor chips; providing a power bus for carrying AC power from the driver output to the input of each of the one or more output circuits in the semiconductor package; operating the driver circuit to drive the transformer in a series of converter operating cycles, each converter operating cycle characterized by two power transfer phases of essentially equal duration during which one or more switches in the driver circuit are ON and power is transferred from the input to the output via the transformer; and deploying the driver circuit at a first location outside of the semiconductor package. Power is supplied to the semiconductor package by the driver circuit at a bus voltage that is a multiple, X, times greater than a load voltage required by the one or more semiconductor chips.

In another aspect, in general, an apparatus includes a semiconductor package including a substrate having a plurality of interface connections connected to at least one surface of the package substrate and one or more semiconductor chips mounted to the substrate, the interface connections adapted for electrical connection to a system board; one or more output circuits housed in the semiconductor package, each output circuit including a printed circuit board, a power transformer including a first winding and a second winding, an input connected to the first winding for receiving AC power, a rectification circuit connected to the second winding for rectifying power received from the transformer, and an output connected to the rectification circuit for supplying DC power to the one or more semiconductor chips; and a power bus connected to selected interface connections for carrying AC power at a bus voltage from the system board to the input of each of the one or more output circuits in the semiconductor package. The bus voltage is a multiple, X, times greater than a voltage required by the one or more semiconductor chips.

In another aspect, in general, a method of packaging a semiconductor die includes providing a substrate for mounting to a bottom surface of the semiconductor die; providing a lid to extract heat from a top surface of the semiconductor die; providing one or more output circuits having a bottom surface mounted to the substrate for supplying power to the semiconductor die; and conducting heat from the bottom of the semiconductor die, into the substrate, from the substrate into the bottom of the one or more output circuits, out of the top of the one or more output circuits, into the lid.

In another aspect, in general, an apparatus includes a semiconductor package including a substrate having a plurality of interface connections connected to at least one surface of the package substrate and one or more semiconductor chips mounted to the substrate, the interface connections adapted for electrical connection to a system board; and one or more power conversion circuits housed in the semiconductor package, each power conversion circuit including an inductive component for converting power from an input at an input voltage to an output at an output voltage for delivery to the one or more semiconductor chips, the inductive component having a magnetically permeable core having an effective permeability of at least 25. The ratio of input voltage to output voltage is fixed, subject to a series resistance, and is at least 5.

In another aspect, in general, an apparatus includes a semiconductor package including a substrate having a plurality of interface connections connected to at least one surface of the package substrate and one or more semiconductor chips mounted to the substrate, the interface connections adapted for electrical connection to a system board; and one or more power conversion circuits housed in the semiconductor package, each power conversion circuit including at least one switch, a switch controller, and an inductive component for converting power from an input at an input voltage to an output at an output voltage for delivery to the one or more semiconductor chips, wherein the switch controller is configured to turn the at least one switch ON or OFF at essentially zero voltage. The power conversion circuit ratio of input voltage to output voltage is fixed, subject to a series resistance, and is at least 5.

In another aspect, in general, an apparatus includes a semiconductor package including a substrate having a plurality of interface connections connected to at least one surface of the package substrate and one or more semiconductor chips mounted to the substrate, the interface connections adapted for electrical connection to a system board;

and one or more power conversion circuits housed in the semiconductor package, each power conversion circuit including at least one switch, a switch controller, and an inductive component for converting power from an input at an input voltage to an output at an output voltage for delivery to the one or more semiconductor chips, wherein the switch controller is configured to turn the at least one switch ON or OFF at essentially zero current. The power conversion circuit ratio of input voltage to output voltage is fixed, subject to a series resistance, and is at least 5.

In another aspect, in general, an apparatus includes a semiconductor package including a substrate having a plurality of interface connections connected to at least one surface of the package substrate and one or more semiconductor chips mounted to the substrate, the interface connections adapted for electrical connection to a system board; and one or more power conversion circuits housed in the semiconductor package, each power conversion circuit including at least one switch, a switch controller, and an inductive component for converting power from an input at an input voltage to an output at an output voltage for delivery to the one or more semiconductor chips. The switch controller is configured to operate the at least one switch to limit slew rates of voltage in the converter to 5 (Vpeak/Top).

In another aspect, in general, an apparatus includes a semiconductor package including a substrate having a plurality of interface connections connected to at least one surface of the package substrate and one or more semiconductor chips mounted to the substrate, the interface connections adapted for electrical connection to a system board; and one or more power conversion circuits housed in the semiconductor package, each power conversion circuit including at least one switch, a switch controller, and an inductive component for converting power from an input at an input voltage to an output at an output voltage for delivery to the one or more semiconductor chips. The switch controller is configured to operate the at least one switch to limit slew rates of current in the converter to less than or equal to 5*(Ipeak/Top).

In another aspect, in general, a method of supplying power received from an input source at an input voltage to circuitry on one or more semiconductor chips mounted in a semiconductor package at a DC output voltage is provided. The method includes providing one or more output circuits for deployment at one or more locations near or adjacent to the semiconductor package, each output circuit including a printed circuit board, a power transformer including a first winding and a second winding, an input connected to the first winding for receiving AC power, a rectification circuit connected to the second winding for rectifying power received from the transformer, and an output connected to the rectification circuit for supplying DC power to the one or more semiconductor chips; providing a driver circuit for deployment at a location spaced apart from the one or more output circuits, the driver circuit having an input for receiving power from the source, circuitry configured to drive a transformer, a driver output for supplying AC power to the one or more output circuits, and circuitry configured to control the power supplied to the one or more output circuits; providing a power bus for carrying AC power from the driver output to the input of each of the one or more output circuits; operating the driver circuit to drive the transformer in a series of converter operating cycles, each converter operating cycle characterized by two power transfer phases of essentially equal duration during which one or more switches in the driver circuit are ON and power is transferred from the input to the output via the transformer; and deploying the driver circuit at a first location outside of an area immediately near or adjacent to the one or more output circuits. Power is supplied to the one or more output circuits by the driver circuit at a bus voltage that is a multiple, X, times greater than the load voltage required by the one or more semiconductor chips.

In another aspect, in general, a method of supplying power received from an input source at an input voltage to a load at a DC output voltage is provided. The method includes providing one or more current multiplier modules at one or more locations in close proximity to the load, the one or more current multiplier modules having a transformer and circuitry for supply DC power to the load; and providing a driver module at a location spaced apart from the one or more current multiplier modules, the driver module having circuitry including an input for receiving power form the input source, control circuitry for generating a controlled driver voltage, and driver circuitry for generating AC power for driving the transformer in each of the one or more current multiplier modules.

In another aspect, in general, a method of making a planar magnetic component is provided. The method includes providing a multilayer printed circuit board (PCB) including conductive features arranged on conductive layers of the PCB to form one or more windings around one or more predetermined axes; forming a hole in the PCB at each of the one or more predetermined axes to accommodate one or more core legs, wherein for each hole, an inner edge of one of the windings overlaps an edge of the hole in a lateral direction after the hole is formed; assembling a first magnetically permeable plate to a first surface of the PCB covering a selected one or more of the holes at the one or more predetermined axes; assembling a second magnetically permeable plate to a second surface of the PCB covering the selected one or more of the holes at the one or more predetermined axes; filling the selected one or more of the holes with at least one of a magnetically permeable fluid or powder; and sealing the selected one or more holes to prevent the at least one of magnetically permeable fluid or powder from escaping.

In another aspect, in general, an apparatus includes a planar magnetic structure including a multilayer printed circuit board (PCB) having a first surface, a second surface, and conductive features arranged on conductive layers of the PCB to form one or more windings around one or more predetermined axes; a hole in the PCB at each of the one or more predetermined axes, each hole having an inner edge aligned with an inner circumference of one of the windings; a first magnetically permeable section affixed to the first surface of the PCB covering a selected one or more of the holes; a second magnetically permeable section affixed to the second surface of the PCB covering the selected one or more of the holes; and at least one of a magnetically permeable fluid or powder disposed in the selected one or more of the holes. The at least one magnetically permeable fluid or powder is contained within the selected one or more holes.

The details of one or more embodiments of the invention are set forth in the accompanying drawings and description below. Other features, objects, and advantages of the invention will be apparent from the description and drawings, and from the claims.

DESCRIPTION OF DRAWINGS

FIG. 15A and FIG. 15B show exploded bottom and top isometric views of a second semiconductor package.

Like references symbols in the various drawings indicate like elements.

DETAILED DESCRIPTION

In contemporary electronic systems, space is at a premium on customer circuit boards, e.g. on a circuit board near a processor. Additionally, thermal management considerations place limits on the efficiency and power dissipation of power supplies at, or near, the point of load. Many very large scale integrated ("VLSI") semiconductor dies such as central processing units ("CPU"), graphics processing units ("GPU"), and application specific integrated circuits ("ASIC") are mounted to a multilayer ceramic substrate which translates the electrical connections from the die to larger connections suitable for interfacing with a customer motherboard. As feature sizes decrease and transistor counts increase, so too do the power supply current requirements for such large chips. Current requirements for a typical CPU can easily exceed 200 amps creating challenges for the package and system designers to efficiently supply such high currents. For example, power connections between the component package (such as a chip carrier or substrate or other package in or on which the semiconductor die is mounted) and the printed circuit board (PCB) on which the package is mounted may demand a large number of connector pins, leads, solder bumps, etc., to carry very high currents challenging package designers to accommodate both power and signal requirements. In many cases the large number and high frequency demands of signals may limit the maximum voltage, e.g. the interlayer breakdown voltage, to which the substrate or package may be subjected, in some cases as low as a few volts, further challenging power connections to and within the package or substrate.

A Factorized Power Architecture well suited for supplying power to low voltage high current loads is described in Vinciarelli, Factorized Power with Point of Load Sine Amplitude Converters, U.S. Pat. No. 6,975,098, issued Dec. 13, 2005 (the "Micro FPA Patent") and U.S. Pat. No. 6,984,965, issued Jan. 10, 2006 (the "FPA Patent") (both assigned to VLT, Inc. of Sunnyvale, CA, and the entire disclosure of each patent is incorporated herein by reference). Power converters which function as DC-to-DC transformers called Voltage Transformation Modules ("VTM") and Sine Amplitude Converters ("SAC") which have a transfer function approximating $Vo=K_{VTM}*Vin-Io*R_{VTM}$ are described in Vinciarelli, Factorized Power with Point of Load Sine Amplitude Converters, U.S. Pat. No. 6,930,893, issued Aug. 16, 2005 (the "SAC Patent") and in Vinciarelli, Point of Load Sine Amplitude Converters and Methods, U.S. Pat. No. 7,145,786, issued Dec. 5, 2006 (the "POL SAC Patent") (both assigned to VLT, Inc. of Sunnyvale, CA, the entire disclosure of each patent is incorporated herein by reference).

I. In-Package Power Conversion Topologies

A. Fault-Tolerant Topology

Figure 5:
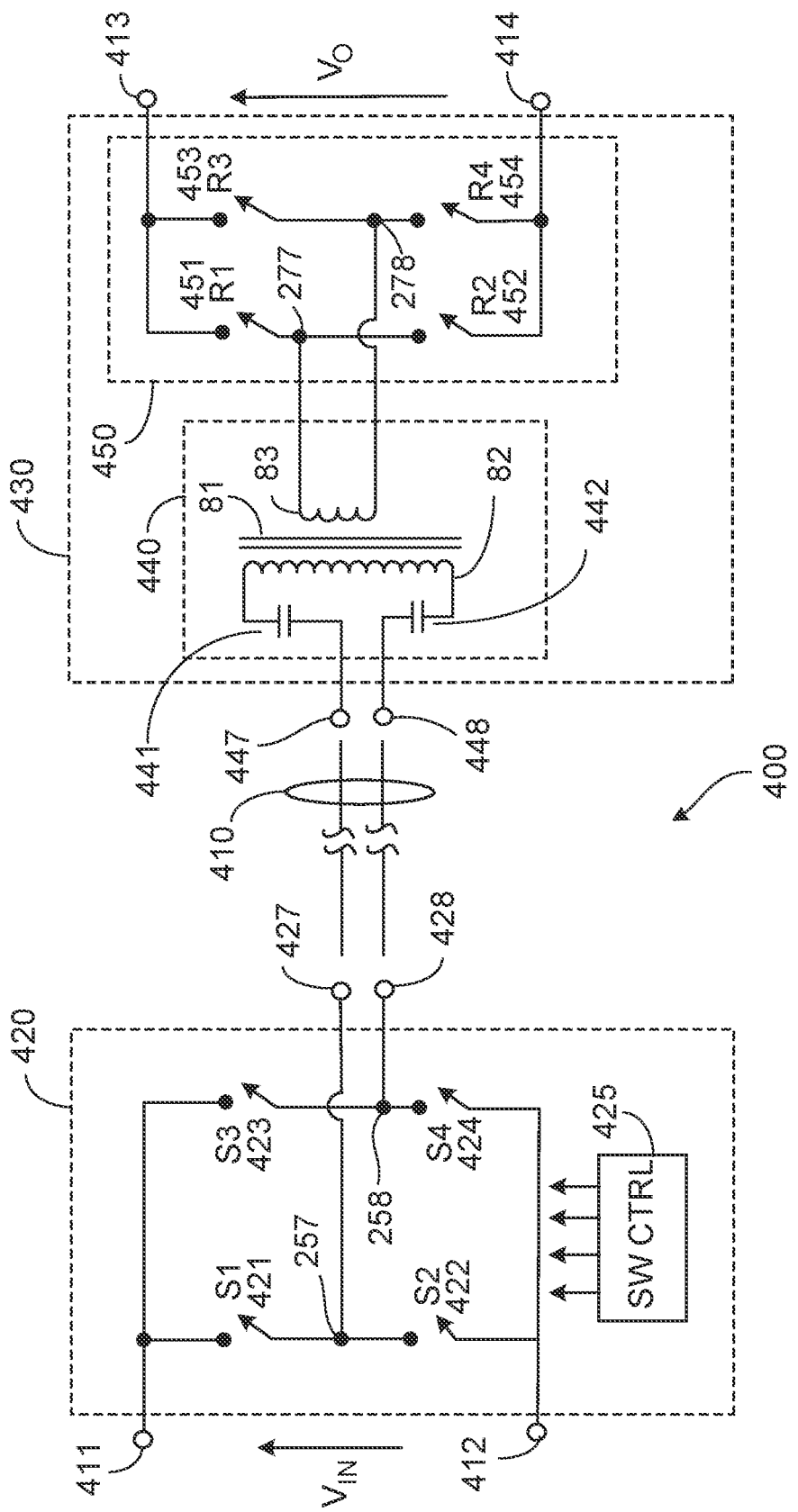
FIG. 5 shows a schematic drawing of a first modular power converter based on the SAC topology.

FIG. 5 is a replica of FIG. 14 from U.S. Pat. No. 9,112,422, issued Aug. 18, 2015, which is incorporated herein by reference in its entirety (hereinafter the "FT Patent"). In FIG. 5, a power converter 400 is shown including a driver 420 connected to drive one or more point-of-load ("POL") current multiplier circuits 430 having inputs 447, 448 connected to the driver outputs 427, 428 via an AC power bus 410. The driver 420 may comprise a full-bridge fault-tolerant input circuit such as input circuit 250 of FIG. 11 in the FT Patent and a switch controller 425 similar to the switch controller described in connection with FIG. 11 of the FT Patent.

The POL circuit 430 may include a transformer circuit 440 and a rectification circuit 450. The transformer circuit 440 may include none, one, or both, of resonant capacitors 441, 442 shown in FIG. 5 connected to the primary winding 82 of transformer 81. The secondary winding may be connected to a full-bridge fault-tolerant rectification circuit 450 as shown in FIG. 5 and described in the FT Patent. The full-bridge fault-tolerant rectification circuit 450 may use switches, R1, R2, R3, R4, operated as rectifiers in the manner described in the FT Patent in connection with output circuit 100 of FIG. 3 (of the FT Patent) and may preferably employ the common-source synchronous rectifiers described in connection with FIGS. 7 and 8 (of the FT Patent). Note that a simplified symbol is used in FIG. 5 for switches S1-S4 and R1-R4 (instead of the enhancement mode MOSFET symbols used, e.g. in FIGS. 2-4, 7, 8, 11 of the FT Patent) in which the arrow indicates the direction of current flow through the intrinsic body drain diode when the switch is open.

As its name implies, the POL circuit 430 (FIG. 5) may be designed to be deployed as close to the point of load, where space and thermal requirements are stringent, as possible. Because the driver circuit 420 does not need to be close to the point of load, it may be deployed elsewhere, away from the point of load, reducing the space required by the POL circuitry and reducing the power dissipation in proximity to the load. One benefit of removing the driver circuitry from the POL is that a larger transformer structure and array of output switches (R1-R4) may be used in the POL circuit thereby improving overall converter efficiency and further reducing dissipation at the POL. Similarly, larger input switches (S1-S4) may be used in the driver circuit to further improve overall efficiency without impacting space considerations at the POL.

However counter intuitive separating the driver 420 from the POL circuitry 430 and deploying an AC bus may initially seem, closer inspection refutes such objections. For example, power carried by the AC bus 410 may be spectrally pure (sine wave) and voltage and current slew rates substantially lower than those typically found in other switching power converter topologies, such as buck and multiphase buck converters, and even in the signal paths of computer circuitry, reducing concerns about noise and electromagnetic emissions.

Figure 8:
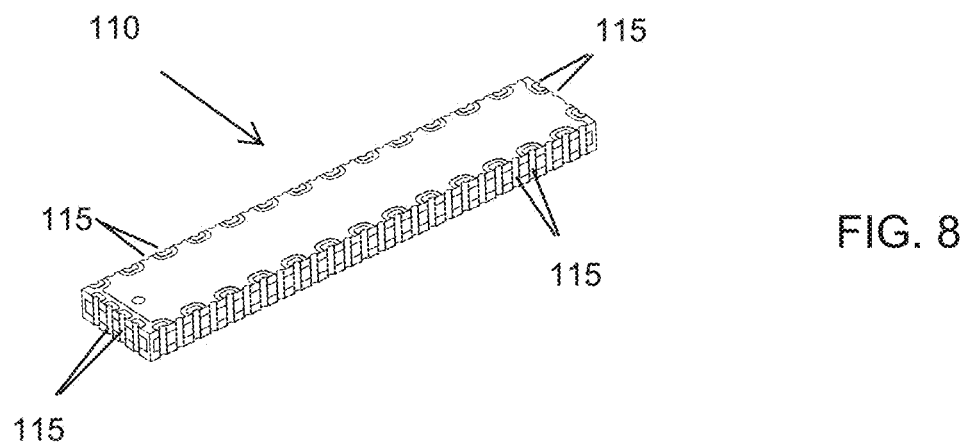
FIG. 8 shows an isometric view of an output circuit.
Figure 6:
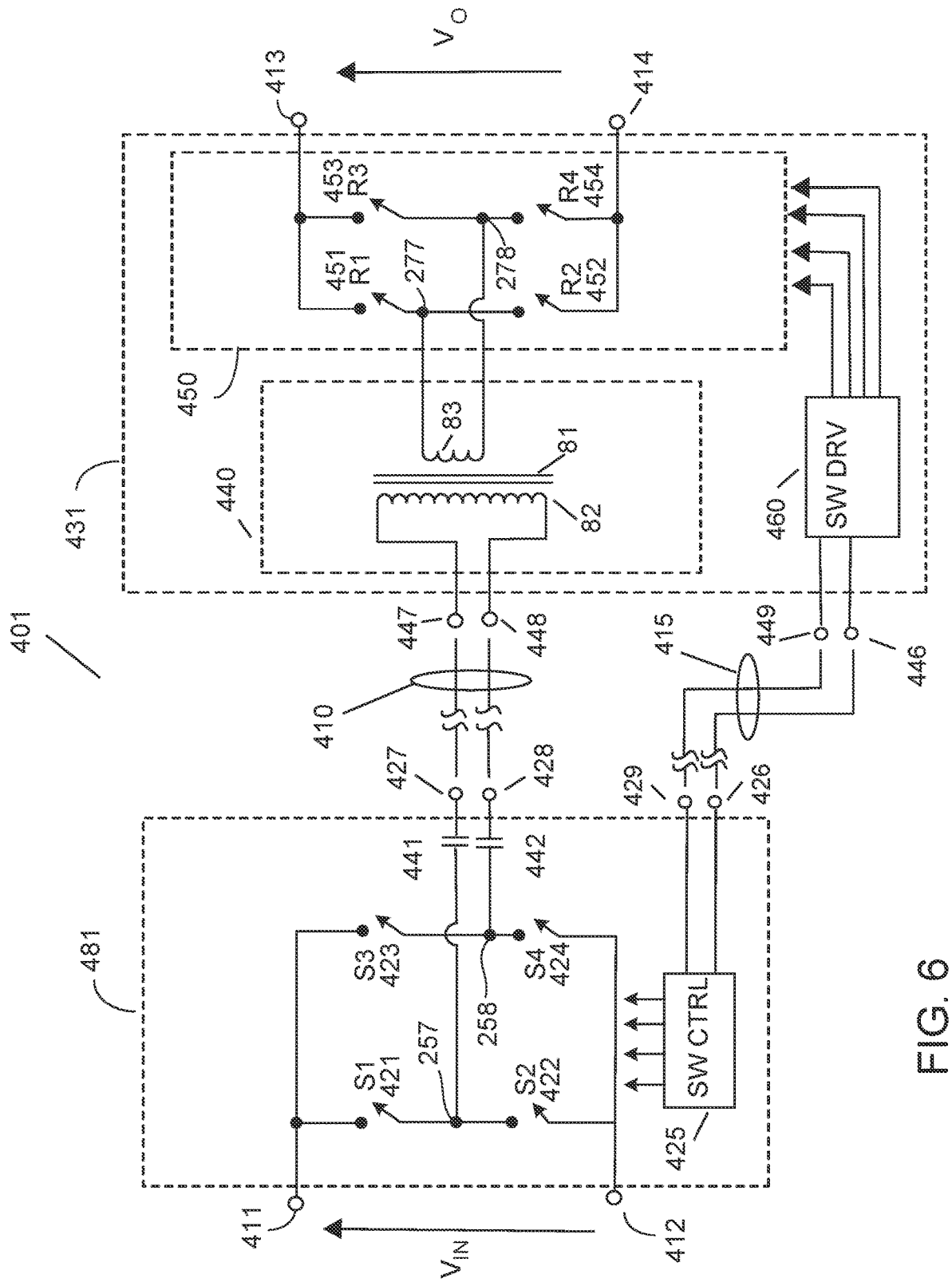
FIG. 6 shows a schematic drawing of a second modular power converter based on the SAC topology.
Figure 7:
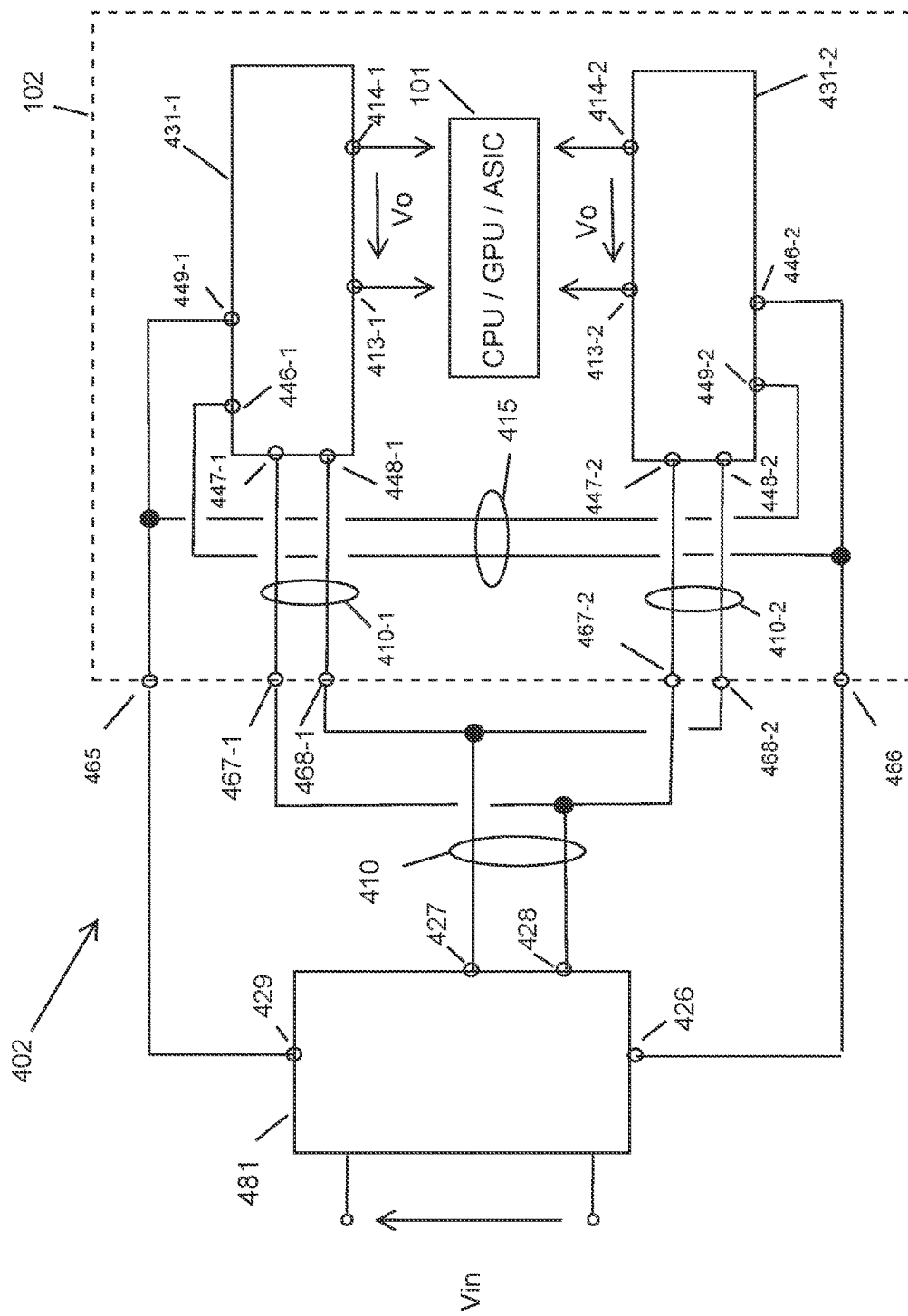
FIG. 7 shows a schematic drawing of a system including a third modular power converter with multiple output chips integrated into a semiconductor package to supply power to a large semiconductor die.

The POL circuit 430 may be enclosed as a single module, i.e. packaged for deployment as a single self-contained unit (as shown in FIGS. 5, 6, and 8), or as a multiplicity, specifically a pair, of modules for deployment as component pairs, e.g. 440 and 450, (as shown in FIGS. 1-3, 7). Because switches R1-R4, need only withstand the output voltage, the rectification circuit 450 may be integrated (with or without the control circuitry, e.g. as shown in FIGS. 7 and 8 of the FT Patent) onto a die with circuitry to which it supplies power, e.g. a processor core or an ASIC.

B. Alternative POL Topology

Referring to FIG. 6, an alternate embodiment 401 of the converter topology is shown comprising driver circuit 481 and POL circuit 431. In addition to outputs 427, 428 for driving the AC power bus 410, the driver circuit 481 as shown also includes a bias output 429 for supplying a small amount of power to operate control circuitry in the POL, and a control output 426 for supplying timing and/or control information to the POL circuit 431. A small signal bus 415 may be provided to connect driver outputs 429, 426, which may be low power and low voltage signals, to the input of the POL circuit 431.

An example of suitable control circuitry is described in Digital Control of Resonant Power Converters, Vinciarelli et al., U.S. Pat. No. 9,166,481, issued Oct. 15, 2015, assigned to VLT, Inc. and incorporated here by reference (the "Controller patent"), e.g. in connection with FIGS. 15 and 16. The driver may further include clamp and control circuitry to implement the clamped capacitor techniques to increase efficiency as described in Clamped Capacitor Resonant Power Converter, Vinciarelli, U.S. patent application Ser. No. 14/874,054, filed Oct. 2, 2015 (the "CSAC" patent application), issued as U.S. Pat. No. 9,325,247 on Apr. 26, 2016 assigned to VLT, Inc. and incorporated here by reference. As shown in FIG. 6, the converter 401 may be partitioned with the resonant capacitors 441, 442 located in the driver module 481. Alternatively, a single resonant capacitor may be located within the driver for ease of implementing the clamp circuitry.

The POL circuit 431 as shown may include a switch driver 460 having inputs 449, 446 for receiving a bias voltage (449) and a control signal (446) from the driver circuit 481. The bias voltage provides power to operate the switch driver and the control signal provides timing information to the switch driver to synchronize operation of the secondary switches 451, 452, 453, 454 as controlled rectifiers. The secondary controller 200B shown in FIG. 15 of the Controller patent may be used for the POL switch driver 460 in FIG. 6. Although the switch driver 460 is shown in FIG. 6 with a dedicated bias supply from the driver, it may, as shown in the Controller patent, derive the power it requires to operate from the control signal or from an independent bias supply. The switch driver 460 may alternatively be co-packaged with, or integrated within, the driver circuit 481 and the secondary switches may be driven directly by the driver circuit 481, in which case the small signal bus may be used to carry gate drive signals for the secondary switches instead of the bias and timing/control signals shown.

The POL circuit 431 may be enclosed as a single module, i.e. packaged for deployment as a single self-contained unit, or as a plurality of modules for deployment as component parts, e.g. transformer module 440, secondary switches 451-454, and driver circuit 460. Because the secondary switches 451-454 need only withstand the output voltage, the rectification circuit 450 may be integrated with driver circuitry 460 onto a single die or even on the same die as the circuitry to which it supplies power, e.g. a processor core, such as a GPU, CPU, or ASIC.

C. Single-Driver Multi-POL Topology

Referring to FIG. 7, another embodiment of the topology is shown as converter 402 including a single driver circuit 481 and a plurality of POL circuits, 431-1, 431-2. The driver circuit 481 and POL circuits 431-1, 431-2 may be the same as driver circuit 481 and POL circuit 431 shown in FIG. 6, respectively. The converter 402 may include an AC bus 410 connected to outputs 427, 428 of driver circuit 481 and a small signal bus 415 (low power, low voltage) connected to the bias 429 and control 426 outputs of the driver 481 for establishing the requisite connections to each POL circuit 431-1, 431-2.

The POL circuits may be connected to operate with their outputs 413, 414 connected in parallel for low voltage loads such as a CPU, GPU, or ASIC 101. Alternatively, inputs to the POL circuits may be connected in series for lower output voltages. To summarize, power may be supplied to the POL circuits 431 by the driver 481 at a bus voltage, Vbus, that is a multiple, X, times greater than the voltage, Vload, required by the load (e.g., one or more semiconductor chips 101). The multiple X may preferably be an integer (or alternatively a non-integer rational number), preferably at least 5, or greater, e.g., 10, 20, and more preferably 40 or more. Each POL circuit may have a fixed voltage transformation ratio, K=Vout/Vin at a load current, where K may be equal to or greater than the turns ratio or step-down ratio, N, of the respective transformer in each POL circuit, depending for example on the output circuitry. The voltage transformation ratio, K, of each POL circuit may be less than or equal to the inverse of the multiple, X=Vbus/Vload, depending on the number and configuration of POL circuits supplying the load. For example, with the inputs and outputs of two or more POL circuits connected in parallel, the bus voltage, Vbus, may be set to X=1/K times the load voltage, Vload: Vbus=Vload/K. Alternatively, it may be preferable for very low output voltages, to arrange a number, M, of POL circuits with their respective inputs connected in series and outputs connected in parallel, in which case the bus voltage Vbus may be set to X=1/(M*K) times the load voltage, Vload: Vbus=Vload/(M*K). The POL circuits 431-1, 431-2 may be deployed as close as possible to the load or preferably co-packaged together with the load as shown schematically in FIG. 7 and mechanically in FIGS. 1-3.

D. Integrated Driver Regulator

Figure 9:
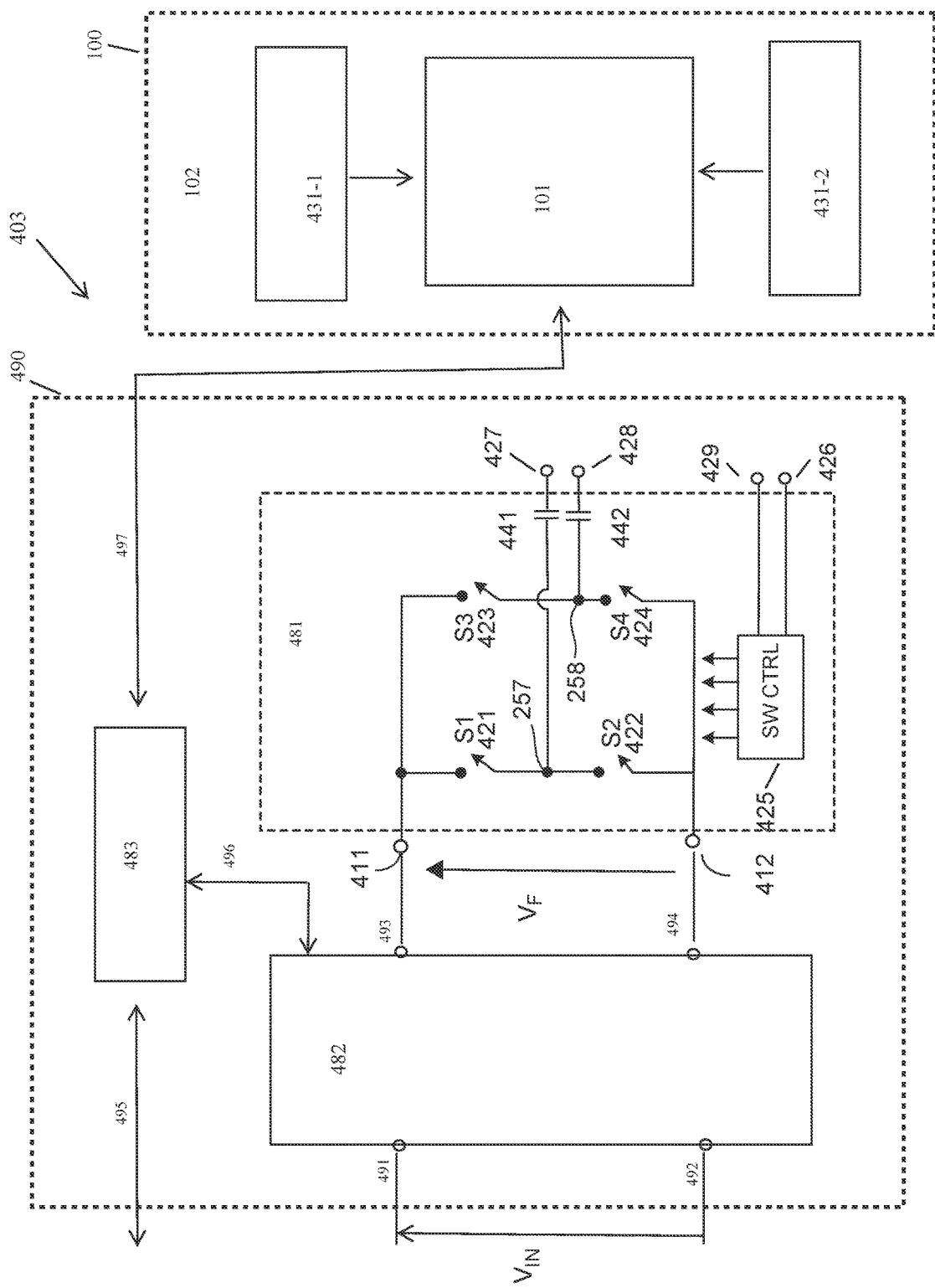
FIG. 9 shows a schematic block diagram of a system including a fourth modular power converter including an improved driver circuit.

Referring to FIG. 9, another power converter system 403 is shown including a driver 490 electrically connected to the semiconductor package 100 via connections formed by a system PCB in which the driver 490 and semiconductor package 100 may be mounted. The bias and control connections (415, FIG. 6) and AC power connections (410, FIG. 6) between the driver 490 and the substrate 102 are not shown in FIG. 9 for clarity, however, it should be understood that the desired connections, e.g. as shown in FIGS. 5-7 may be provided in the manner described above. The driver 490 as shown in FIG. 9 may include the transformer driver circuitry 481 (which may be of the type shown in FIG. 5 or 7), a power regulator circuit 482, and a supervisory circuit 483. The power regulator 482 may be used to control the voltage, $V_F$, input to the driver circuit 481 as a means of controlling the AC voltage supplied to the POL circuits 431-1, 431-2 and in turn the DC output voltage to the semiconductor die 101.

The supervisory circuit 483 may be connected to communicate with the semiconductor die 101 and optionally the POL circuits 431-1, 431-2 via a digital or analog communication bus 497 as shown in FIG. 9. Although shown as a single bus, the semiconductor die 101 and POL circuits 431 may have one or more separate buses for direct communication on the substrate 102 and the supervisory circuit 483 may have separate busses for communication with the die 101 and with the POL circuits 431, e.g. to accommodate different communication speeds and protocols. The supervisory circuit 483 may be connected to communicate with external system components via a digital or analog communication bus 495 as shown in FIG. 9, e.g. to report on conditions in the semiconductor package or power system, e.g. temperature, voltage, current, power, fault conditions, etc. or to receive commands, e.g. reset, disable, etc. For example, some CPU's require the power system to adjust the voltage supplied to the CPU in response to commands issued by the CPU, e.g. many Intel processors send VID information to a voltage regulator which in turn adjusts the voltage supplied to the processor. The supervisory circuit 483 may receive such voltage commands from the semiconductor die 101 via bus 497 and issue appropriate commands to regulator 482 via digital or analog communication bus 496 to adjust the output voltage. The regulator may, in response to commands received from the supervisory circuit 483, adjust the DC output voltage of the output circuits (via the control voltage, $V_F$) to comply with the requirements of the semiconductor die 101.

E. Multi-Driver Multi-Rail Topology

Figure 13:
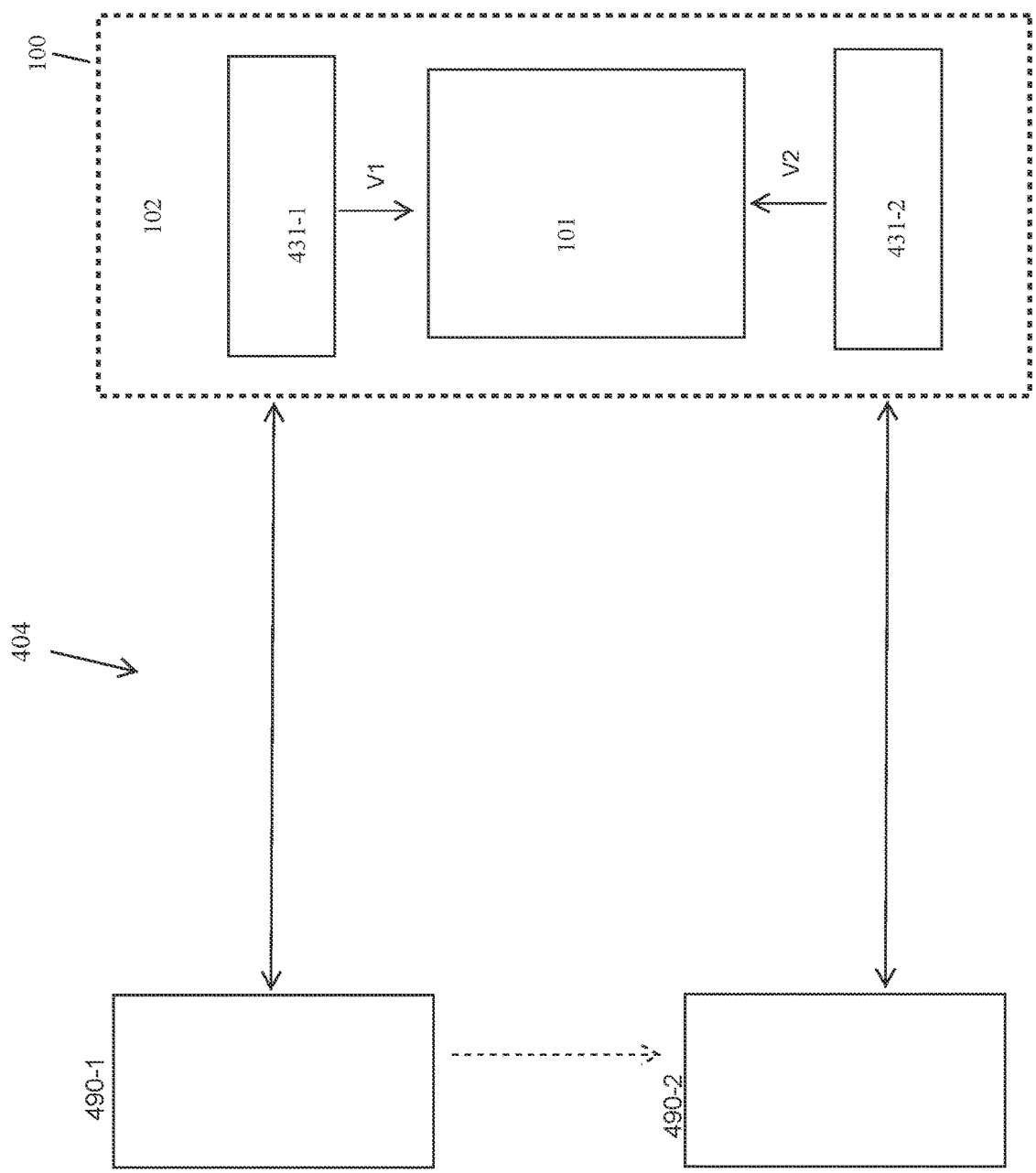
FIG. 13 shows a schematic block diagram of a system including a fifth modular power converter.

Referring to FIG. 13, another embodiment of the topology is shown as converter 404, which is configured to supply multiple voltage supply rails, V1, V2, to the semiconductor load 101. Converter 404 includes two driver circuits 490-1, 490-2 for driving two POL circuits, 431-1 and 431-2, respectively. The driver circuits 490-1, 490-2 and POL circuits 431-1, 431-2, may be of the same type as driver circuit 490 (shown in FIG. 9) and POL circuits 431 (shown in FIG. 6), respectively. For simplicity, the connections between the drivers and POL circuits and semiconductor package are shown as single connections, it being understood that each may include an AC power bus, a control bus, and communications bus as described above. Preferably, the drivers may be synchronized to the same clock as shown in FIG. 13 by the broken arrow from driver 490-1 (the master) to driver 490-2 (slave). Preferably, the POL circuits 431-1 and 431-2 may be co-packaged as a single POL circuit module 431. Each driver may, in response to commands received from the semiconductor die 101, adjust the DC output voltage of the POL circuit associated with it to comply with the requirements of the semiconductor die 101. For example, driver 490-1 may adjust the output V1 of POL circuit 431-1 and driver 490-2 may adjust the output V2 of POL circuit 431-2.

F. Driver Compensation

Separation of the driver 481 and integrated controller 425 (FIG. 6) from the POL circuits 431 may introduce parasitic capacitances and inductances, which, depending upon the layout of the customer's system board, e.g. the distance between driver and POL circuits and the size and routing of the electrical connections between them, may adversely affect operation of the converter. For example, the parasitic inductance may lower (raise) the resonant frequency (period) of the resonant circuit (formed by the resonant capacitors 441, 442 and the transformer 440) which if uncompensated can lead to timing errors in the operation of the switches disrupting zero-voltage switching (ZVS) and zero-current switching (ZCS) operation, which in turn may lead to increased losses, power dissipation, and noise.

Preferably, the driver 481 may include compensation circuitry able to detect and adjust for the effects of parasitic capacitances and inductances introduced by the separation of driver and POL circuits and the vagaries of different system board layouts on converter operation. One method uses current detection, e.g. in one or more of the primary switches (e.g. switches 421, 422, 423, 424 in FIG. 6) of the driver circuit (using known techniques such as sensing the voltage across a switch while in the ON state) to detect errors in the switch timing. For example, if the compensation circuitry detects that the resonant current at the end of a power transfer interval has not returned to zero, the controller may incrementally increase the duration of the power transfer intervals until the current returns to zero or within a tolerance band of zero, e.g. 1% of the maximum resonant current. For the clamped version described in the CSAC patent application, the compensation circuitry may additionally sense the rate of change of the switch current at the end of the first resonant interval, extending it until the rate of change of the current returns to zero, or within a tolerance band of zero, or within a percentage of the maximum rate of change, e.g. 10%, 5%, or 1%. In this way, the compensation circuitry may adjust the overall timing of the converter operating cycle and/or specific aspects of the converter operating cycle, e.g. the power transfer intervals (described in the SAC, POL-SAC, and Controller patents), or the first and second resonant intervals (described in the CSAC patent application), etc.

II. Semiconductor Package with Top-Mounted Integrated POL Circuits

Figure 1:
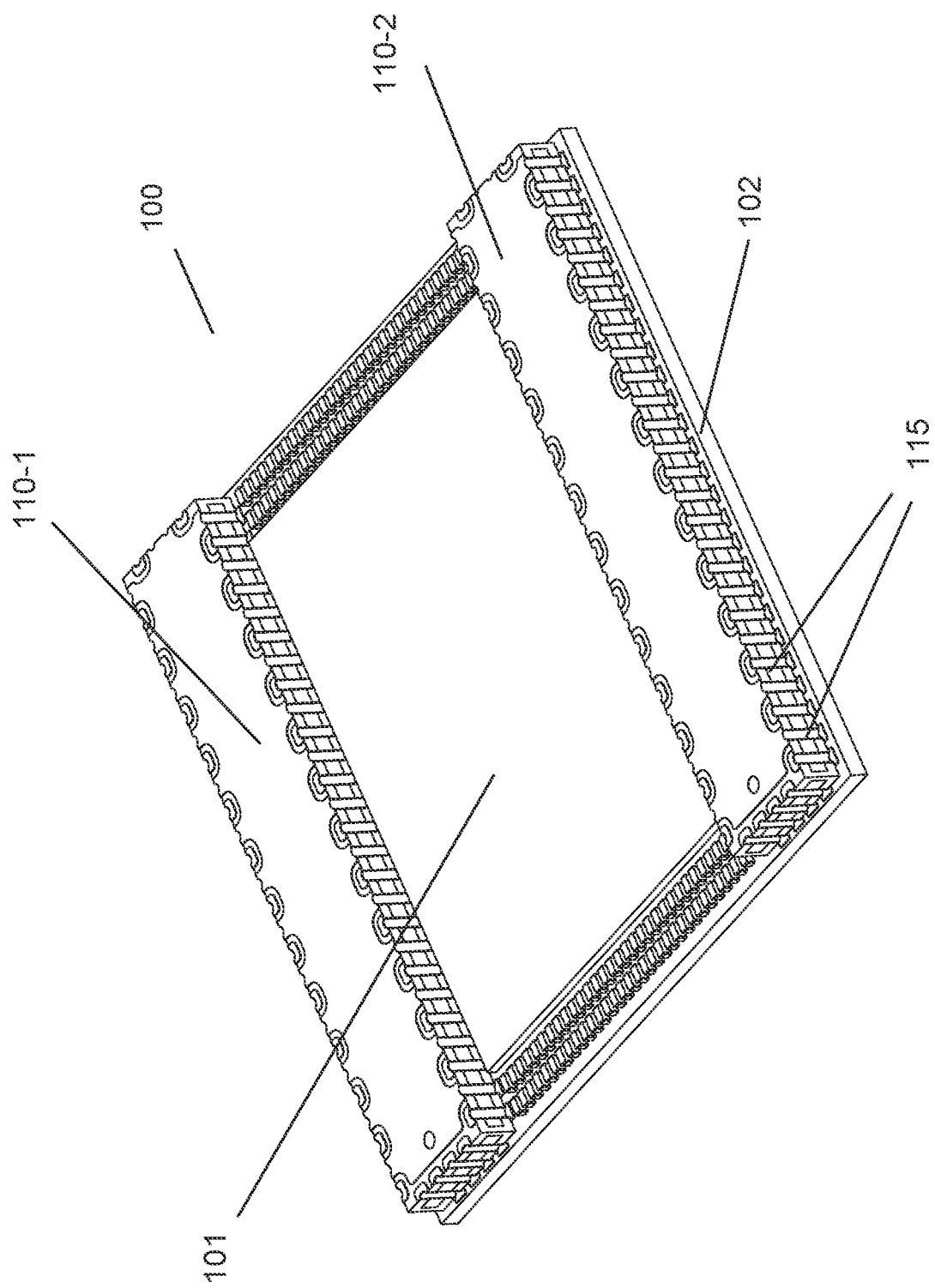
FIG. 1 shows an isometric view of a semiconductor package with integrated power converter output circuitry.
Figure 2:
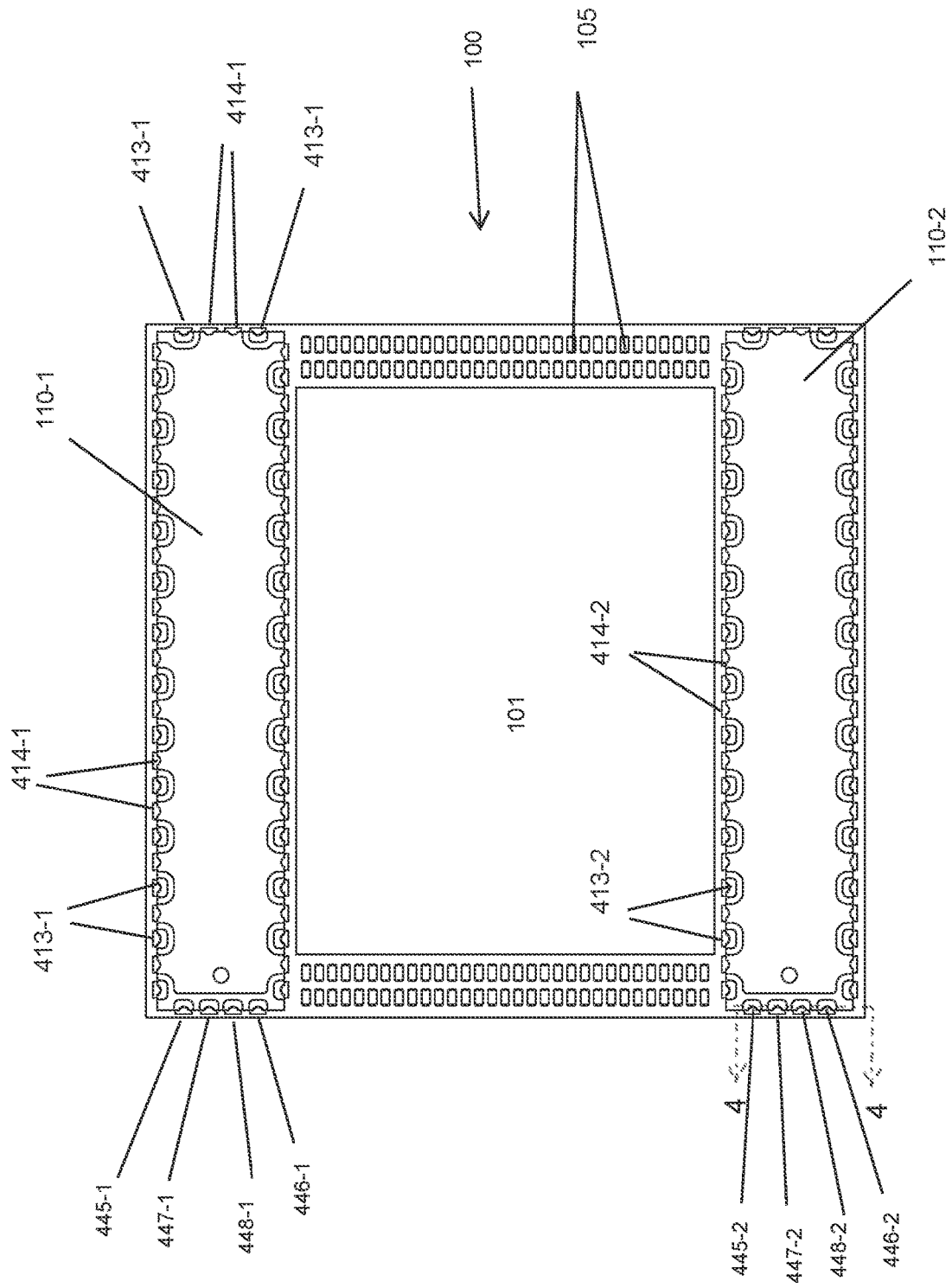
FIG. 2 shows a top plan view of the semiconductor package.
Figure 3:
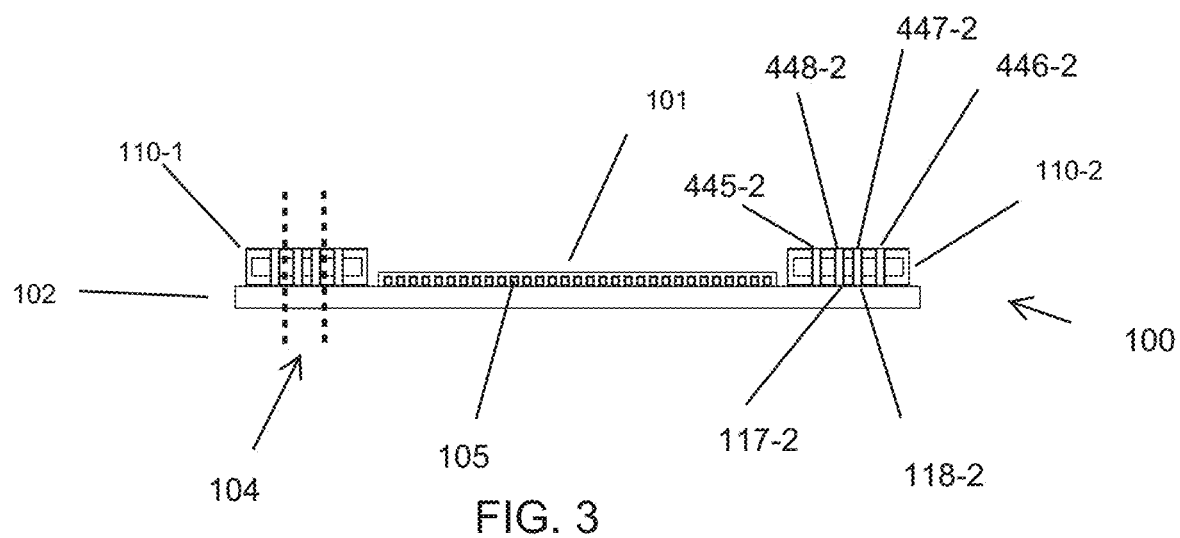
FIG. 3 shows a side view of the semiconductor package.

In FIGS. 1, 2 and 3, a semiconductor package 100 is shown (in isometric, top plan, and side views, respectively) including a multilayer substrate 102, a large semiconductor die 101, such as an ASIC, CPU, or GPU, and a plurality of POL modules 110-1, 110-2 mounted to the substrate adjacent to the semiconductor die 101. As shown in FIG. 8, the POL modules 110 may be packaged as a leadless module, such as described in Vinciarelli, et al., Panel Molded Electronic Assemblies with Multi-Surface Conductive Contacts, application Ser. No. 14/731,287, filed Jun. 4, 2015 (the "Panel Mold"application"), issued as U.S. Pat. No. 10,264, 664 on Apr. 16, 2019, and incorporated here by reference, having connections 115 (FIGS. 1, 8) for surface mount soldering to respective conductive pads on the substrate 102 and preferably include shielding for improved low noise performance. (See, e.g. leadless electronic module 100 described in connection with FIGS. 1-3 of the Panel Mold application.) The POL modules 110-1 and 110-2 (FIGS. 1-3) may each include a respective POL circuit, e.g. 431-1, 431-2, as described in connection with FIG. 7.

Referring to FIG. 1, the POL modules 110-1, 110-2 are shown having a multiplicity of electrical contacts 115 arranged along their respective perimeters. The contacts may be formed as shown in FIGS. 1-3 and 8 (and as described in the Panel Mold application) to extend along the entire vertical span of the perimeter walls and onto the top and bottom module surfaces. The common terminals may be extended as shown onto the top and bottom surfaces to form shielding. As shown for the two POL Module example in FIGS. 1-3, a plurality of discrete components 105, such as capacitors, e.g. for filtering, may be provided in the free space along the semiconductor die 101. It may be preferable for very high current applications to use four POL modules, each mounted along a respective one of the four sides of the semiconductor die 101 to lower the interconnection resistance between the POL module outputs and the die. Using four POL modules to power the die may allow a reduction in the length of each POL module, e.g. by a factor of two, leaving space for discrete components such as capacitors along a respective one of the four sides of the semiconductor die 101.

In FIG. 2, several of the contacts 115 are labeled to show their preferred function. For example, at the left end of each POL module as shown in FIG. 2, two terminals are labeled consistent with FIG. 7 showing the AC power inputs 447-1 and 448-1 for module 110-1 and 447-2 and 448-2 for module 110-2; similarly, two terminals are labeled showing the respective bias and control inputs: 449-1 and 446-1 for POL module 110-1 and 449-2 and 446-2 for POL module 110-2. A multiplicity of output terminals 413-1, 413-2 and ground terminals 414-1, 414-2 are provided along the perimeter of the POL modules 110-1, 110-2 respectively to provide a low impedance distributed connection to the substrate.

In FIG. 7, the substrate 102 of semiconductor package 101 is represented with broken lines: electrical connections between the substrate 102 and a system board (to which it may be connected) are represented by interface connections 465, 466, 467-1, 468-1, 467-2, and 468-2; connections contained within the broken lines may be formed by the substrate 102; and connections outside the broken lines may be formed by the system board which typically may be a multi-layer printed circuit board ("PCB"). The driver circuit 481 may be mounted away from the point-of-load, e.g. the semiconductor die 101 or the semiconductor package 100, on the system level board, which may provide electrical connections between the driver and the semiconductor package 100 or substrate 102 as shown symbolically in FIG. 7. Note that connections to the semiconductor die 101, which may be great in number, are not shown in FIG. 7 for clarity.

The substrate 102, in typical applications, carries a multitude of electrical connections between the semiconductor die 101 and a system-level PCB using, e.g. connector pins, ball grid array, land grid array, or other connection schemes. The breakdown voltage of the substrate 102 may be very low, e.g. on the order of 3 to 5 volts; the number of interface connections available for power connections between the substrate 102 and the system PCB may be limited due to the large number of input/output signals ("I/Os") required by the semiconductor die 101; and consequently the ability to efficiently conduct large power supply currents may be limited. In FIG. 7, the POL circuit bias power connections 449-1 and 449-2 and control connections 446-1 and 446-2 are shown connected to bias and control interface connections 465, 466 respectively. The POL circuit power connections 447-1, 447-2, 448-1, and 448-2 are shown connected to a power interface connections 467-1, 467-2, 468-1, 468-2.

As shown, the bias and control signals (FIG. 7), which are relatively low in voltage and power, may be handled by the substrate 102 and interface connections 465, 466 in the same manner as normal I/O signals to, and within, the package, e.g. the bias and control signals may be routed laterally along the substrate as shown by the small signal bus 415 within the substrate 102 (FIG. 7). However, connections to the AC power bus 410, which may need to carry voltages exceeding the voltage capabilities of the substrate 102, may not be suitable for wiring on the substrate. Accordingly, FIG. 7 shows a separate set of interface connections (467, 468) for carrying AC power from the bus 410 to each of the POL circuits (431-1, 431-2): interface connections 467-1 and 468-1 for POL circuit 431-1; and interface connections 467-2 and 468-2 for POL circuit 431-2. The AC power interface connections 467 and 468 will be described in greater detail with reference to the semiconductor package drawings of FIGS. 1-4.

A. High Voltage Connections

Figure 4:
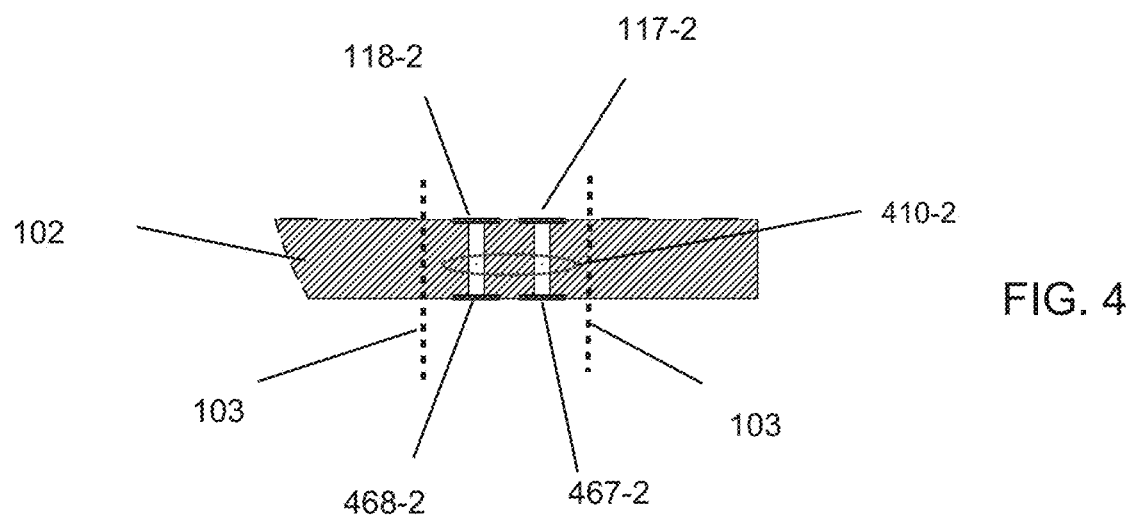
FIG. 4 shows a cross-sectional view of a portion of the substrate of the semiconductor package revealing power input connections for the output circuitry.

The section taken along lines 4-4 (FIG. 2) is shown enlarged in the cross-sectional view of FIG. 4 providing physical detail of the AC power bus 410-2 (FIGS. 4, 7) in the substrate 102. Because its voltage may exceed the voltage rating of the substrate, the AC power bus, e.g. 410-2, may be kept as short as possible in the substrate preferably extending vertically through the thickness of the substrate 102 from the interface connections 467-2, 468-2 on the bottom of the substrate to the conductive pads 117-2, 118-2 on top of the substrate for mating with POL module terminals 447-2, 448-2, respectively. The interface connections (e.g., 467-2, 468-2) on the bottom of the substrate 102 may be electrically coupled to connectors on the system board using, e.g. connector pins, ball grid array, land grid array, or other connection schemes. All lateral travel of the AC power bus in the substrate is preferably eliminated or, if unavoidable, then minimalized. In the example shown in FIGS. 1-4, the AC power bus is divided into two sections 410-1 and 410-2 each of which consist of a pair of plated vertical through holes in the substrate 102 around which a minimum keep out distance is maintained to account for the low interlayer breakdown voltage of the substrate. Thus as shown in FIG. 4, AC power bus 410-2 includes two vertical conductive through holes (collectively 410-2) connected to interface contacts 467-2, 468-2 on the bottom of the substrate 102 and conductive pads 117-2, 118-2 on the top of the substrate 102, all of which are preferably vertically aligned minimizing or eliminating any lateral conduction requirements for the AC power bus. The heavy broken lines 103 in FIG. 4 indicate a volume 104 of the substrate 102 defined by a projection around the high voltage connection in which no other electrical features should be formed to manage the relatively high voltage requirements of the AC power bus and the low breakdown voltage of the substrate. Ground referenced through holes may be formed in the substrate around the keep-out area to provide shielding.

B. Magnetic Field Management

Figure 12:
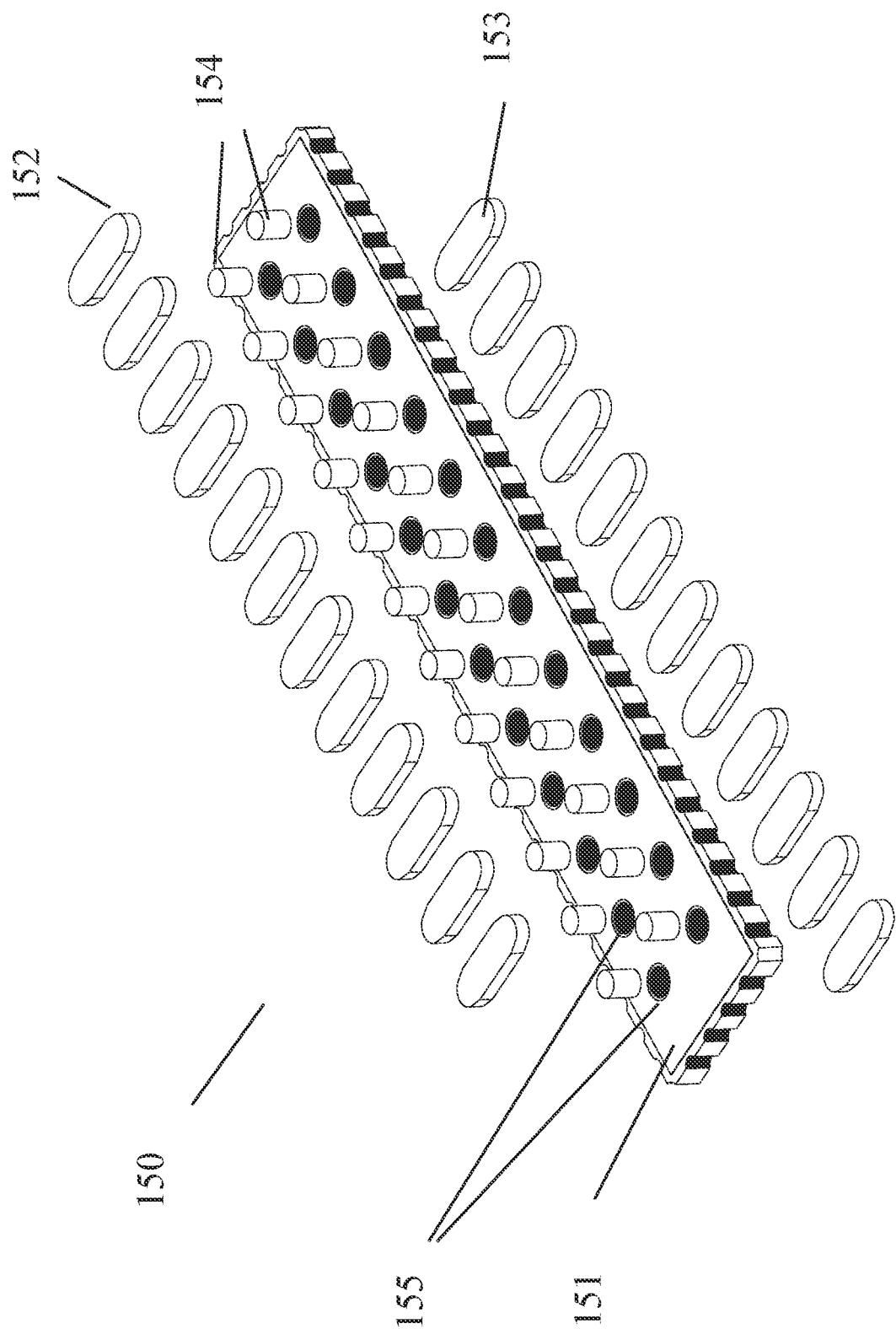
FIG. 12 shows an exploded view of a transformer structure for use in an output circuit.

Referring to FIG. 12, an example of a magnetically permeable core structure 150 in the POL modules 110-1, 110-2 is shown including a multilayer printed circuit board 151 in which the transformer windings (not shown) may be formed around a plurality of holes 155. The transformer may incorporate self-aligned windings as described in Vinciarelli, Self-Aligned Planar Magnetic Structure and Method, U.S. patent application Ser. No. 14/822,561, filed Aug. 10, 2015, (the "Self-Aligned" patent application), issued as U.S.

Pat. No. 10,468,181 on Nov. 5, 2019, assigned to VLT, Inc. of Sunnyvale, CA, the entire disclosure of which is incorporated herein by reference) reference. Core legs 154 may be placed in the holes 155 and mated with top and bottom core plates 152 and 153 when assembled to form complete magnetic loops. A small gap of 1 mil or less may be provided between one or both of the top and bottom core plates and the legs. Preferably, the effective magnetic permeability (μ) of the core legs and core plates is greater than 25 and preferably greater than 100, and more preferably greater than 200 to contain the magnetic flux during operation. Lower effective permeability core structures may result in greater flux leakage which can couple to signal conductors in the substrate, semiconductor die, or system board creating noise problems.

Figure 14A:
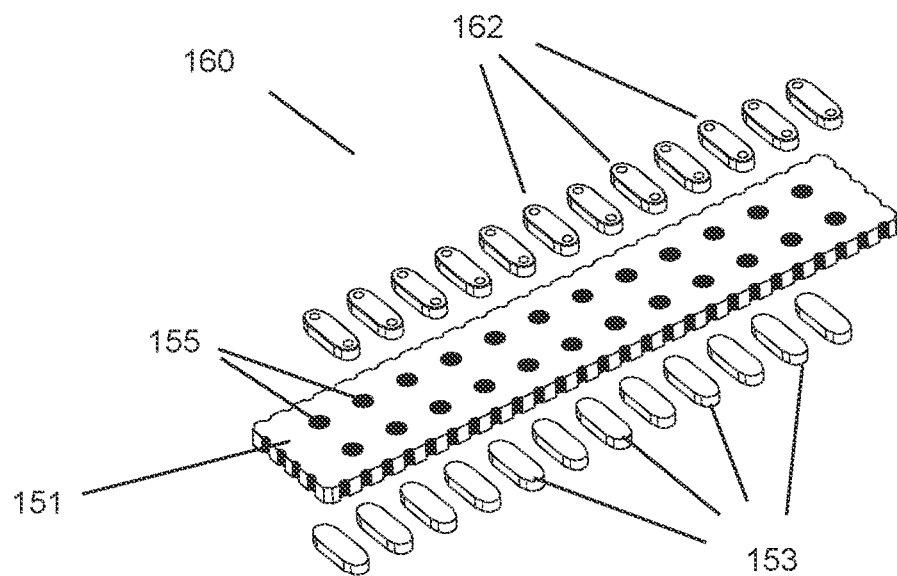
FIG. 14A and FIG. 14B show exploded and assembled views of an alternate transformer structure for use in an output circuit.
Figure 14B:
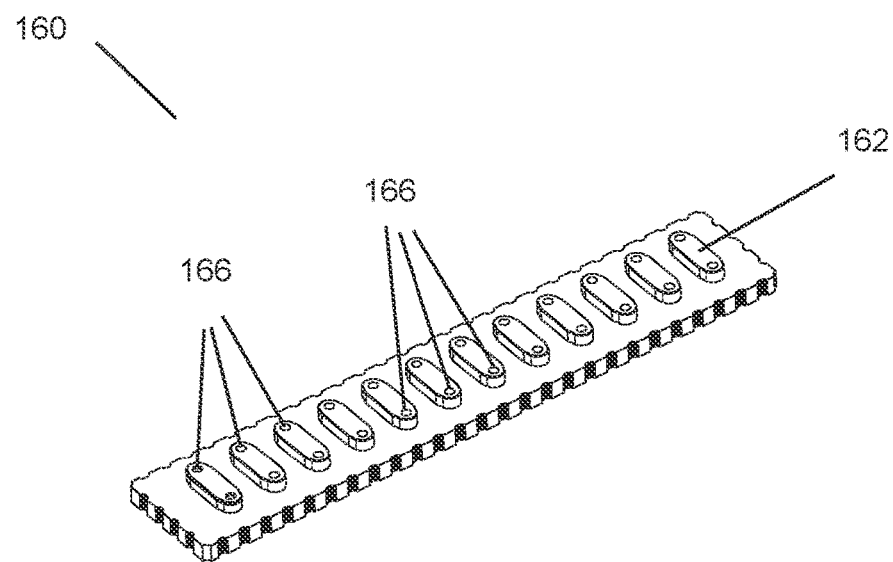

Referring to FIGS. 14A and 14B, an alternate transformer structure 160 is shown having essentially the same PCB 151 in which the transformer windings (not shown), preferably self-aligned windings described in the Self-Aligned patent application, may be formed around a plurality of holes 155 to accommodate core legs such as the core legs 154 shown in FIG. 12, and bottom core plates 153 on the bottom surface of the PCB 151. The top core plates 162 may as shown include apertures 166 arranged to align with apertures 155 in the PCB when the core is in position. The transformer 160 may be fabricated by affixing the bottom core plates 153 to the bottom surface of the PCB 151 with a suitable adhesive such as epoxy. The top core plates 162 may be similarly affixed to the top surface of the PCB 151 with apertures 166 aligned with apertures 155. A magnetically permeable fluid, such as a powder with or without a suitable binder material or other injectable material, preferably having a permeability of 10 or greater, may be injected through apertures 166 to fill the PCB apertures 155 and alternatively some or all of the core apertures 166. After the apertures are filled with the magnetically permeable material, the core apertures may be sealed with an epoxy or other suitable material to prevent the magnetically permeable material from escaping. One or more plugs can be disposed in one or more of the apertures 166, in which the one or more plugs form seals covering the respective one or more of the apertures 166. Optionally, the PCB may be heated before the apertures are filled and sealed to ensure that the apertures are completely filled after the PCB is cooled. For example, the core plate 153 can be a ferrite core plate, and the core plate 162 can be a ferrite core plate having one or more apertures that is/are filled with one or more plugs.

The transformer structure 160 of FIGS. 14A and 14B may be particularly well suited to low voltage and high frequency applications such as the POL circuits discussed above. Using a material that may be injected as a powder or fluid into the apertures in the PCB overcomes the mechanical tolerances of conventional planar magnetic core structures where small solid core legs have to fit within small PCB apertures. By replacing small solid magnetic core legs with magnetic powder or fluid, PCB apertures can be filled with a permeable medium providing greater PCB aperture utilization and converter efficiency.

Additionally, as mentioned above, the output circuit may be covered with a conductive covering, preferably connected to a common terminal, to provide additional shielding.

C. Noise Management

The POL modules 110-1, 110-2, and preferably the driver circuits also, may use zero-current switching and/or zero-voltage switching to minimize the slew rate of voltages and currents in and around the semiconductor package 100 and system board. The power converter topologies shown in FIGS. 6, 7, and 9 may preferably be based on the Sine Amplitude Converter ("SAC") topology described in the SAC patent or on the clamped capacitor resonant topology described in the CSAC patent application. The SAC topology is preferred for the sinusoidal current and voltage waveforms and zero-current switching ("ZCS") and zero-voltage switching ("ZVS") and the ability to constrain the slew rates of voltages and currents in the converter. For example, the slew rates may be limited to dV/dT≤Vpk/(Top*0.2) and dI/dT≤Ipk/(Top*0.2) in the output circuits shown in FIGS. 6 and 7 using the SAC topology. In contrast, multiphase buck regulators typically exhibit characteristic current slew rates an order of magnitude greater than those in the output circuits.

In one example, the POL modules 110-1, 110-2 in the semiconductor package 100 may use a current multiplication factor K of 48 and an input voltage of 48 volts to supply 1 VDC at 100 A to the semiconductor die. Using a SAC topology operating at 1 MHz (Top=1 μS), the maximum voltage is 48V and the maximum current Iin=100/48=2.1 Amps. Thus, the voltage and current slew rates for the output circuit may be limited to 240 V/μS and 10.4 A/μS.

D. Thermal Management

Figure 10:
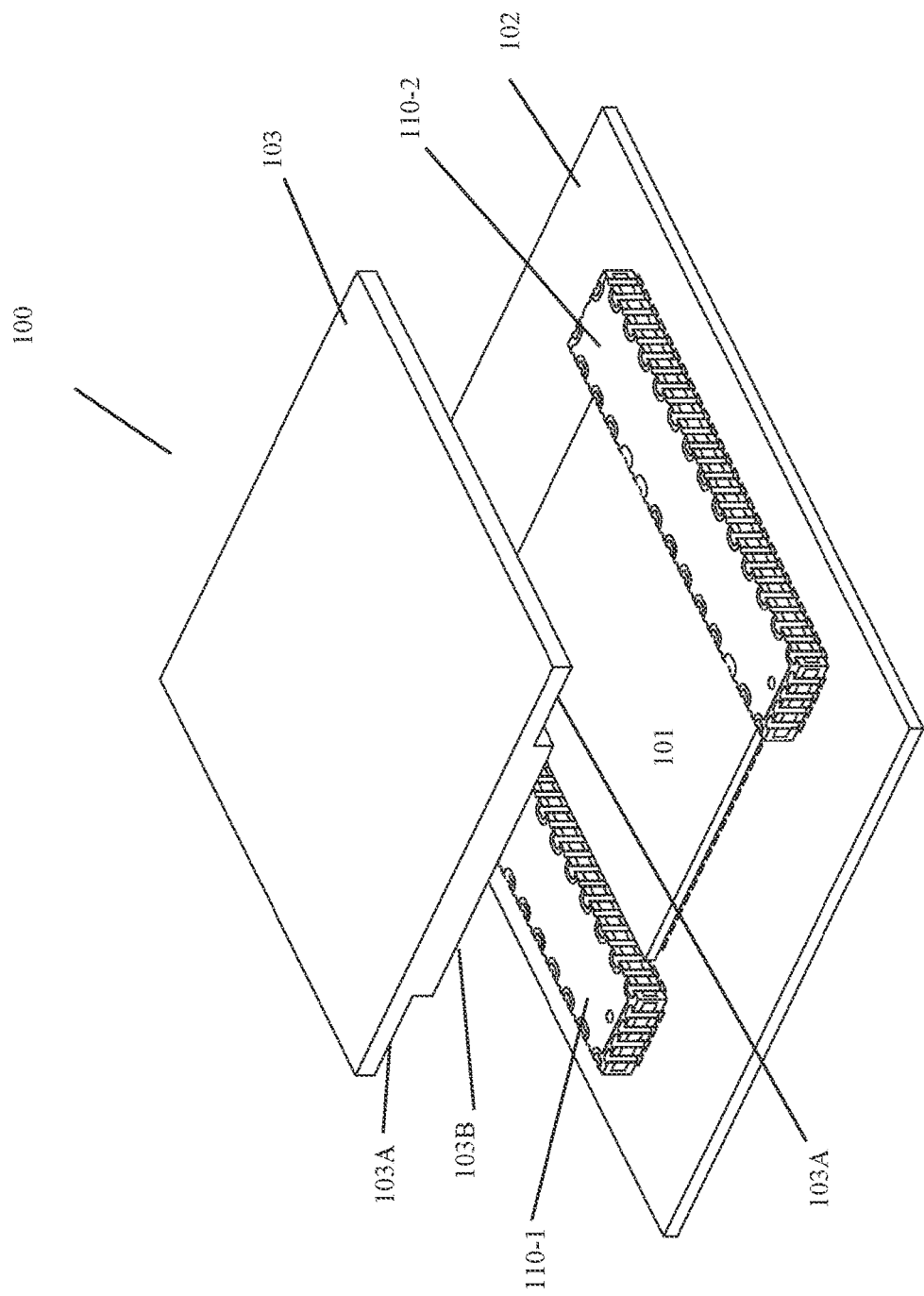
FIG. 10 shows an isometric view of the semiconductor package with the lid exploded from the assembly.

The semiconductor package 100 may include a lid 103, preferably made of thermally conductive material such as aluminum, copper, or other metallic or non-metallic thermally conductive material as shown in FIG. 10. The lid as shown may have a stepped lower surface to mate or accommodate the difference in height between the relatively short semiconductor die 101 and the relatively tall POL modules 110-1, 110-2. Lower surfaces 103A of lid 103 may mate with the top surfaces of the POL modules 110-1, 110-2 and lower surface 103B may mate with the top surface of the semiconductor die 101. Referring to the side view of the semiconductor package 100 in FIG. 11, dotted arrows 104, 105 and 106 show the direction of heat flow in the package. Heat generated by the semiconductor die 101 typically flows up through the lid as shown by arrow 106. Other proposed in-package power solutions rely on removal of the heat generated in the regulator circuits through the substrate, thus heating the substrate and the semiconductor die. However, the POL modules 110-1, 110-2, as shown provide thermally conductive conduits between the substrate and the lid, facilitating removal of heat generated by the output circuits directly through the lid and further provide a path for heat flow from the die 101 through the substrate 102 and up through the POL modules 110-1, 110-2 as shown by arrows 105 and 104. As a result, the package 100 provides thermally enhanced operation over other solutions.

III. Semiconductor Package with Bottom-Mounted Integrated POL Module

Referring to FIGS. 15A, 15B, 16A, 16B, 17, and 20, a second semiconductor package 300 is shown in bottom and top isometric exploded, top and bottom isometric assembled, and side views, respectively. Like the package 100 described above (FIGS. 1-3, 10, 11), the second semiconductor package 300 includes a multilayer substrate 302 and a large semiconductor die 301, such as an ASIC, CPU, or GPU, mounted on a top surface 302A of the substrate 302 and also includes a POL module 310. However, as shown in FIGS. 15A, 15B, 16A, 16B, and 17, the POL module 310 may be mounted on the bottom surface 302B of the substrate 302 beneath the die 301 in semiconductor package 300. Although FIGS. 15A, 15B, 16A, 16B, and 17 show a single large POL module 310, a plurality of smaller POL modules may be used in place of the single large module shown.

Preferably, the POL module 310 (or POL modules) may occupy substantially all of the area beneath the semiconductor die 301 in the same, or a very similar, footprint allowing the remaining area, i.e. outside of the projection of the semiconductor die footprint, on the bottom surface, to be used for making connections between the substrate 302 and a system board. For example, the POL module 310 may preferably be smaller than, and fit completely within the footprint of, the die 301 as shown in the side view of FIG. 17. Note the difference 304 between the edge of the die 301 (on the top surface 302A of the substrate) and the edge of the POL module 310 on the bottom 302B of the substrate, which appears in FIG. 17 as symmetrical overhang on the left and right sides of the POL module. Although the POL module is shown slightly smaller than the die, it may be the same size as or slightly larger than the die, provided sufficient area remains for making connections between the die and the system board.

Figure 16A:
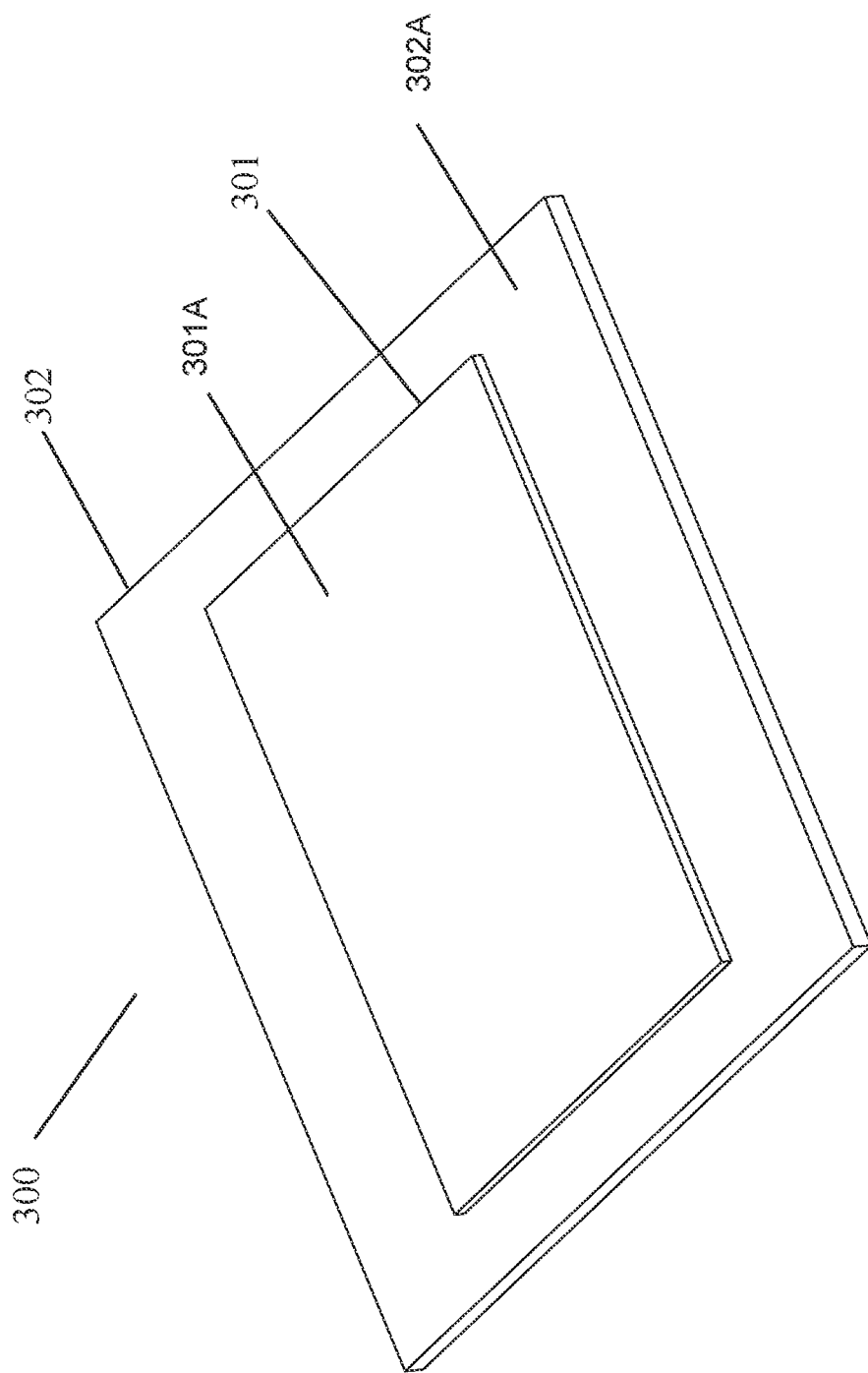
FIG. 16A and FIG. 16B show top and bottom isometric views of the second semiconductor package assembled.
Figure 16B:
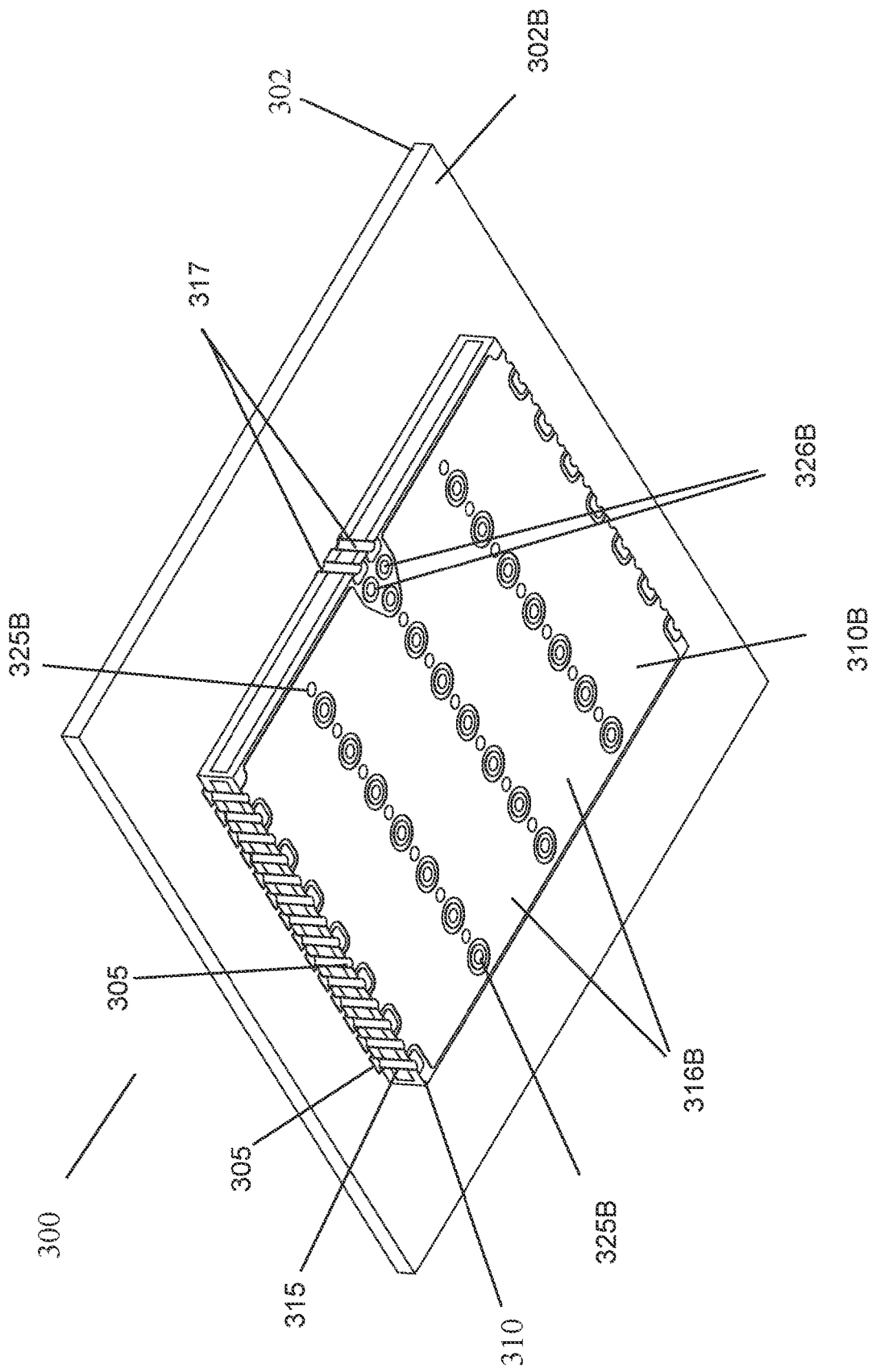
Figure 17:
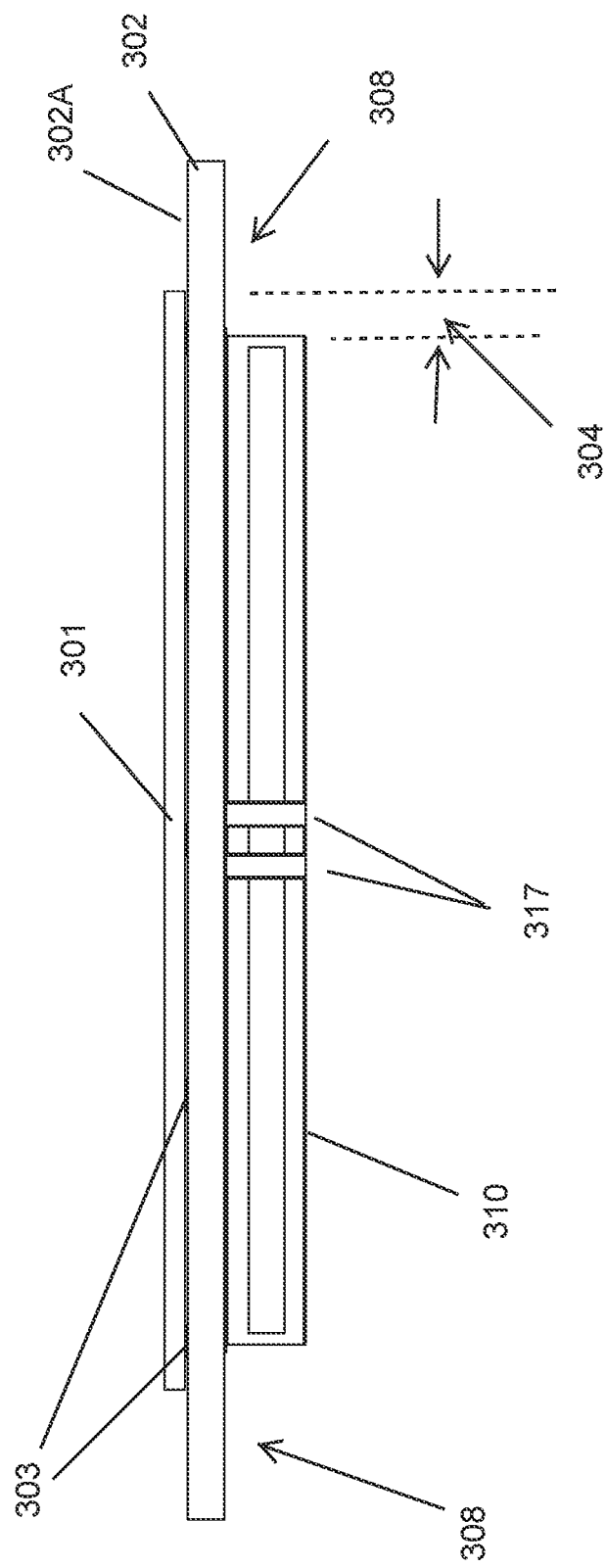
FIG. 17 is a side view of the second semiconductor package.

As shown in FIGS. 15-17, the POL module 310 may be preferably packaged as a leadless module, such as described in the Panel Mold application, having electrical connections for surface mount soldering to respective conductive pads on the substrate 302. For example, conductive terminations, e.g. terminations 315, may be provided along two or more sides of the POL module 310 for surface mount soldering to conductive pads 305 on the bottom 302B of the substrate 302. Additionally, conductive terminations, e.g. terminations 325A may be arranged along the top surface 310A of the POL module 310 for surface mount soldering to conductive pads 305 on the bottom 302B of the substrate 302. A pair of the conductive terminations, preferably located centrally and near an edge of the POL module 310 may be provided for making AC power connections, e.g. terminals 326A shown in FIG. 15B along a centerline and close to one edge of the POL module 310. Conductive terminations for the relatively low power bias and control signals may be provided along an edge of the module, e.g. terminals 317 are shown formed in an edge of the POL module 310 in FIG. 15B.

Figure 15A:
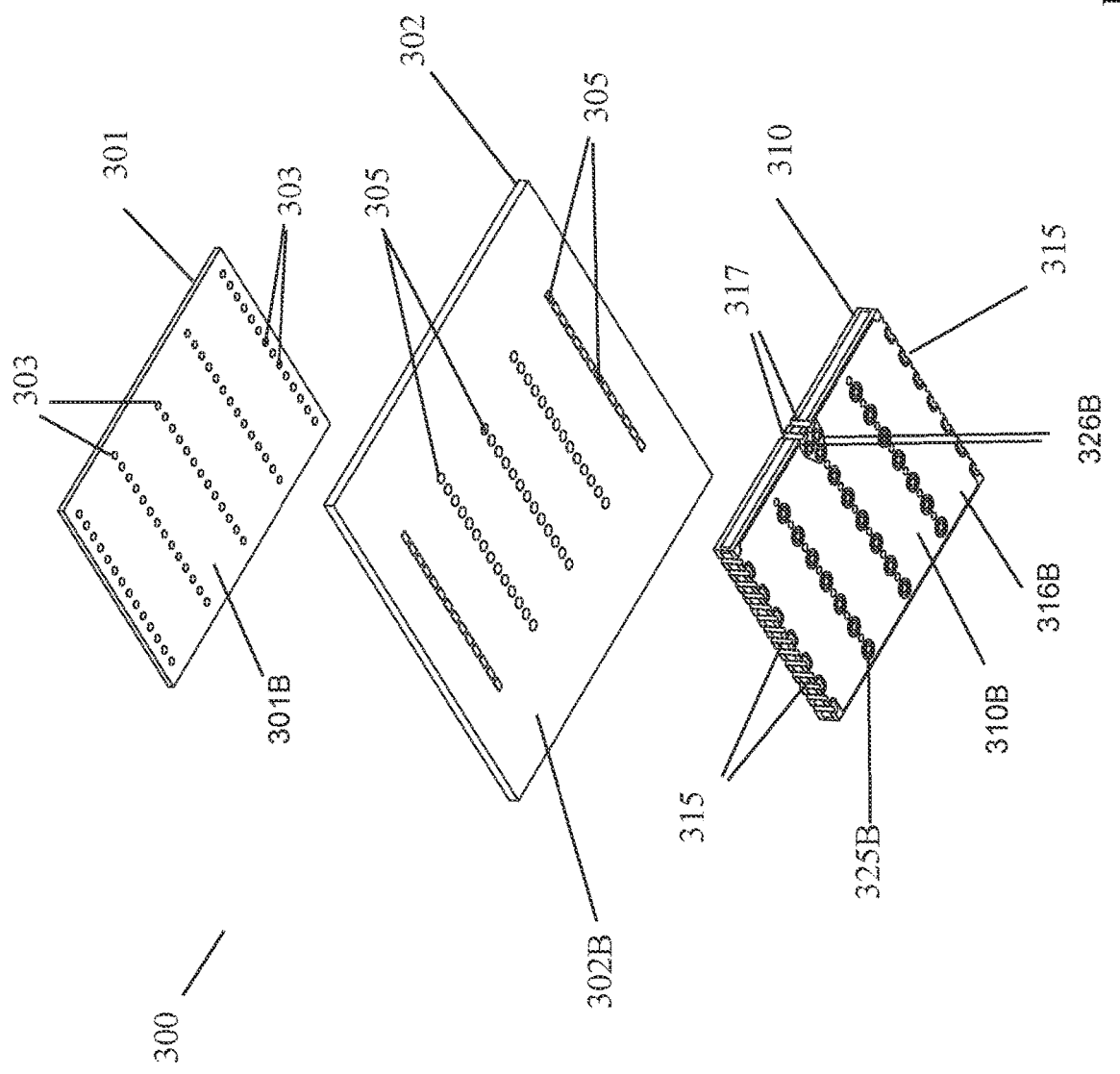

Preferably the conductive pads 305 on the bottom surface 302B may be electrically and thermally connected to conductive pads 307 on the top surface 302A of the substrate 302 (e.g. using conductive vias between the substrate layers (not shown)), which connect with power terminals 303 located on the bottom surface 301B of die 301. As shown in FIGS. 15A, 15B, and 17, direct vertical alignment may be established between power terminals 303, conductive pads 307, conductive pads 305, and conductive terminations 315 providing the shortest electrical and thermal path between the POL module 310 and the die 301. Additionally, the power terminals 303, conductive pads 307, conductive pads 305, and conductive terminations 315 may be spatially arranged to allow signal connections to be routed between them on the inner and optionally outer layers of the substrate 302. For example, the power connections including terminals 303, pads 307, vias (not shown), pads 305, and terminations 315 and 325A are shown spaced apart and generally arranged in columns, e.g. five columns are shown in FIGS. 15A, 15B. As shown in FIG. 15B and 16B, the POL module 310 may include conductive coverings 316A, 316B extending over the top 310A and bottom 310B surfaces of the POL module 310, which as discussed above may enhance the thermal and noise performance of the POL module 310 and help contain the magnetic fields in the transformer cores.

Figure 11:
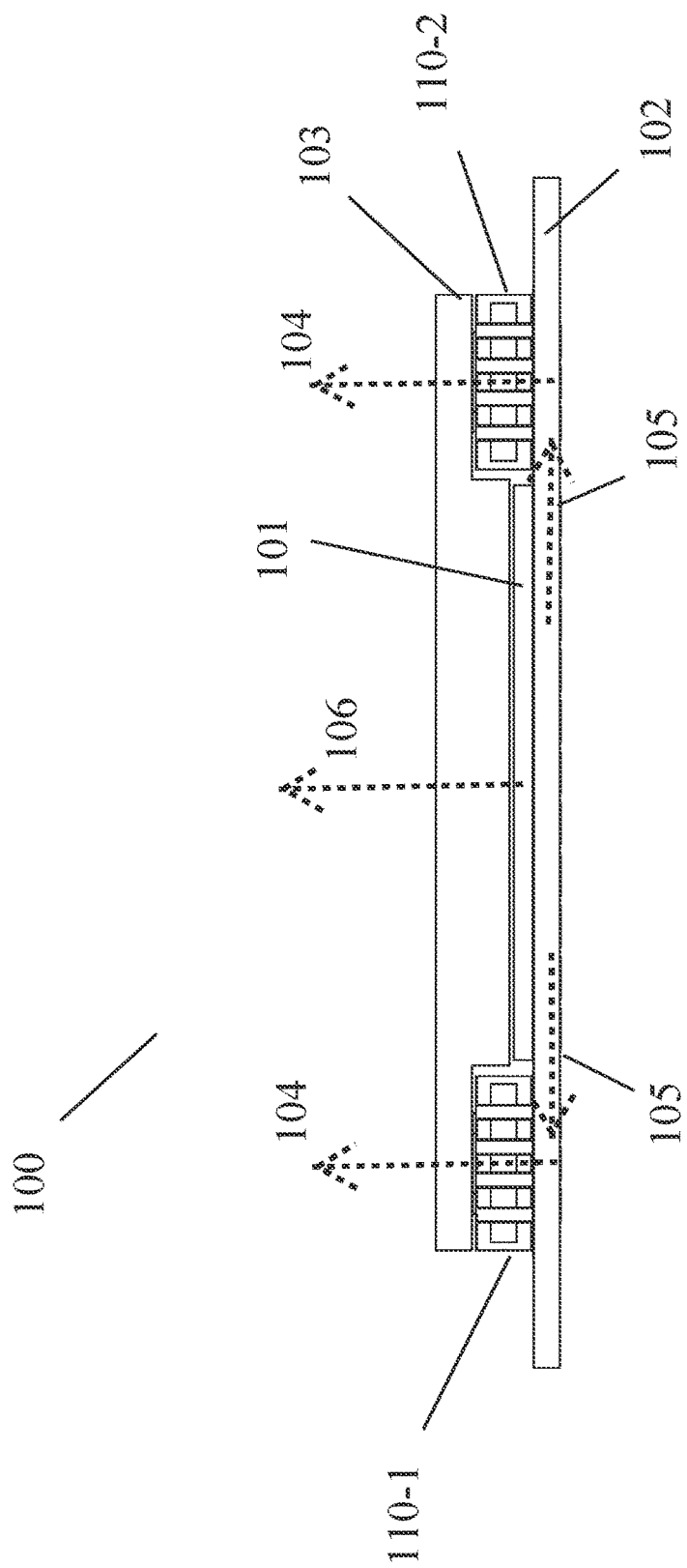
FIG. 11 shows heat flow in a side view of the semiconductor package with lid.

Referring to FIG. 16B, the POL module 310 may optionally include conductive terminals, 325B, 326B on the bottom surface 310B preferably aligned with the respective conductive terminations 325A, 326A on the top surface 310A of the POL module 310. Such through-module terminations, described in the Panel Mold application, may enhance the thermal conductivity, providing heat conductors through the POL module 310. As described in the Panel Mold application, a conduit (an example of which, conduit 265, is shown in FIG. 11 of the Panel Mold application) may expose conductive features to provide thermal and electrical connections between a substrate and the top and/or bottom conductive layers. The conductive terminations 325B, 326B may be used to engage with suitable terminations on the system board, directly or through a socket, to provide electrical connections and/or allow heat to be conducted away through the system board as described below in connection with FIG. 20A.

Remote Gate Driver

Figure 19:
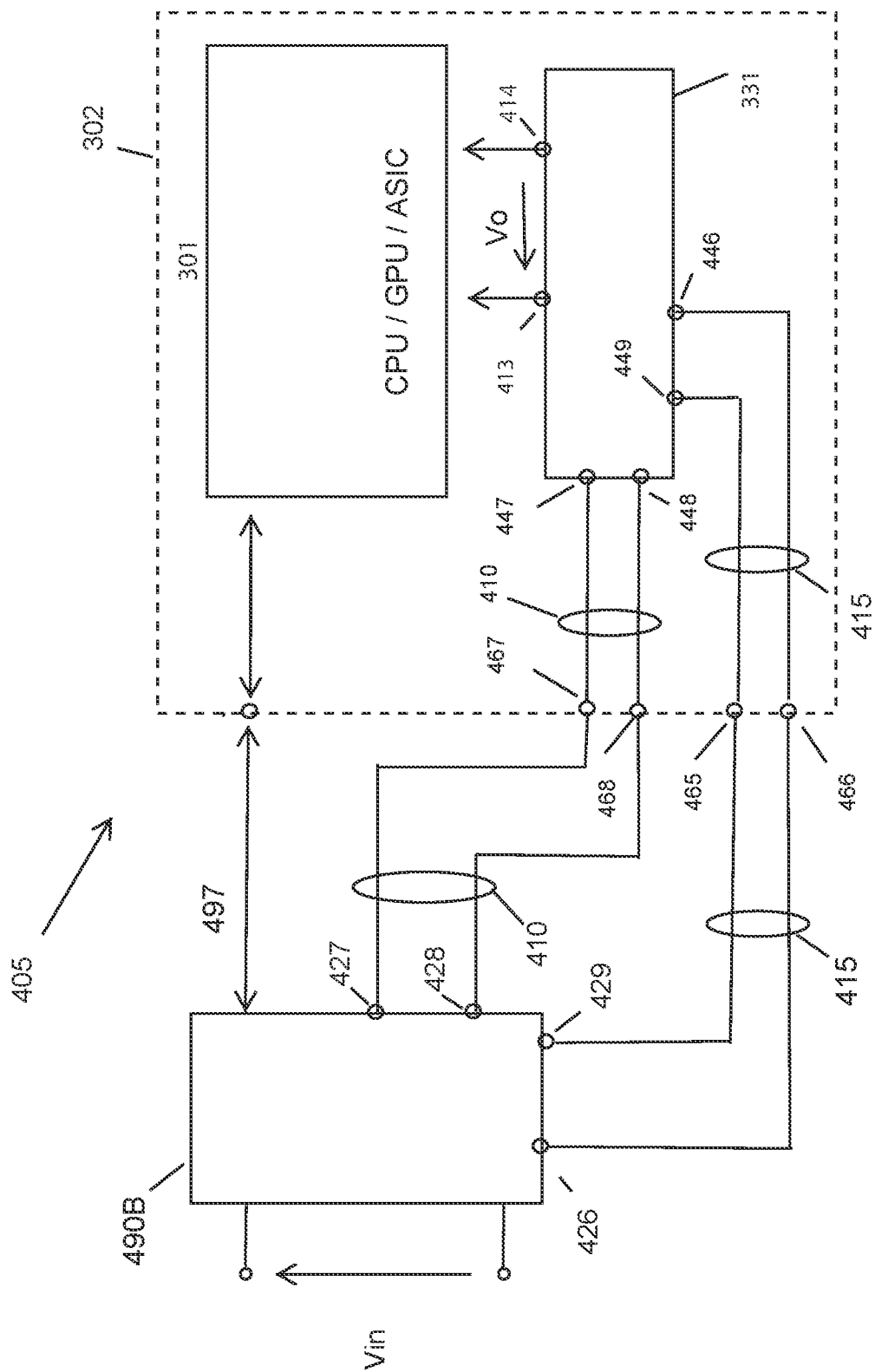
FIG. 19 is a schematic drawing of a system including a sixth modular power converter with an output chip integrated into a semiconductor package to supply power to a large semiconductor die.

Referring to FIG. 19, another power converter system is shown including a driver 490B, the semiconductor package 300 including the die 301 and a POL circuit 331 which may include the output transformer 440 and secondary switches 451-454 of the POL circuit 431 (FIG. 6). Preferably, the driver 490B may include transformer driver circuitry (481, FIG. 9) including switch control circuitry (e.g. 425, FIG. 9), power regulator circuitry (482, FIG. 9), and supervisory circuitry (483, FIG. 9) as described above and may be electrically connected to the semiconductor package 300 via connections formed by a system PCB (e.g. system board 11A or 11B in FIGS. 20A, 20B) on which the driver 490B and semiconductor package 300 may be mounted. Preferably, the switch driver (460: FIG. 6) which is shown as part of the POL circuits described above (431: FIG. 6) may be incorporated into the driver 490B (FIG. 19) to further reduce the size of the POL module 310.

Although counterintuitive because of the high switching frequency and the parasitic inductances introduced by the system board, the package of the driver 490B, the POL module package, and the semiconductor package 300, the switch driver may incorporate resonant gate driver techniques (See, e.g. Controller patent: Col. 13, ln 56-Col. 15, ln 24; FIGS. 8, 9) to use the inductances introduced by the connections between the separated driver 490B and the POL module 310 in semiconductor package 300 as some or all of the inductance required to resonantly charge and discharge the gate capacitances of the secondary switches in the rectification circuit of the POL module 310. Preferably additional inductance may be added in series with gate runs of the gate drive circuit using discrete, e.g. chip, inductors, to trim the circuit to the desired resonant frequency. For example, a power converter of the type shown in FIG. 19 configured to operate at 2 MHz with 250 nS half-cycles may require gate-voltage rise and fall times of 60-80 nS. Secondary switches configured to deliver 350 to 400 Amperes to the load may require 60 nC of gate charge to turn ON or OFF, representing approximately 12 nF of gate capacitance on each terminal 446, 449. The total inductance in the driver circuit between gate drivers in the driver 490B and the secondary switches in the POL module 310 therefore should be limited to 7.6 to 13.5 nH. Allowing for 1 nH of package inductance for each of the driver and POL module and discrete inductance of approximately 3 nH, the maximum distribution inductance budget for the gate runs is between 2.6 and 8.5 nH. Design rules may be provided to keep the gate runs within the allocated inductance budget, e.g. limiting the length and width of the conductive traces, requiring a ground plane in an adjacent layer separated by an acceptable dielectric thickness.

As described above, the controller may detect and adjust for small timing errors produced by differences in the parasitic inductances in the AC power bus 410 and in the gate drive signal bus 415. Preferably, more than 50%, or 75%, or most preferably more than 90% of the energy stored in the gate capacitances of the secondary switches in the POL module 310 may be recycled using at least in part the inductances introduced by the wiring between driver and POL module.

As shown in FIG. 19, the control outputs 426, 429 of driver 490B (e.g. either bias and control or gate driver outputs) may be connected to a signal bus 415 on the system board which may in turn be connected to terminals 465, 466 on the substrate 302 of the package 300 and carried through the substrate 302 to input terminals 449, 446, respectively. Similarly, a communication bus 497 as described above in connection with FIG. 9 may provide communication between the semiconductor package 300, e.g. with the die 301, and supervisory circuitry in the driver 490B.

The AC power connections 410 between the driver 490B (outputs 427, 428) and the POL module 310 (AC Inputs 447, 448) may be provided in part by the substrate 302 in the manner described above in connection with FIG. 4 using suitable conductor free zones around the AC connections formed in the substrate. Providing connections between the POL module 310 and the driver 490B through the substrate 302 may require routing the AC power laterally in or on the substrate in turn requiring elimination of any conductive features in a volume surrounding the AC power conductors, e.g. in a space radially around the conductors including a number of adjacent layers above and below the layer in which the AC power connections are made. Alternatively, the AC power connections 410 may be established between the system board (e.g. system board 11A, FIG. 20A) and the POL module 310 directly, e.g. using a socket 15 with suitable conductive terminations 16B to engage with terminations 326B on the bottom surface 310B of the POL module 310.

Figure 18:
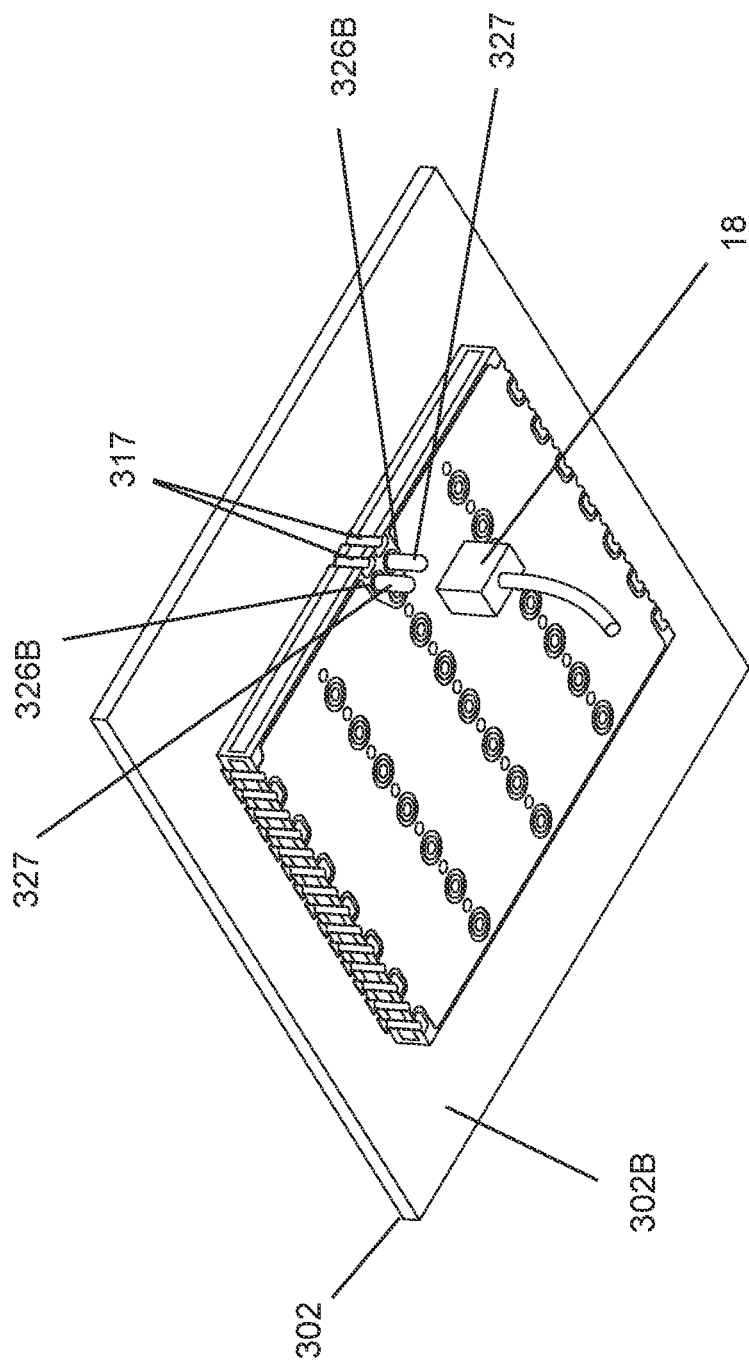
FIG. 18 is a bottom isometric view of a third semiconductor package.

Alternatively, the AC power connections 410 between the system board and the POL module 310 may be formed using a wire harness 18 including a connector body configured to engage with AC power pins 327 preferably protruding from the bottom surface 310B of the POL module as shown in FIG. 18. The AC power pins 327 may be configured to be inserted into, engage with, and soldered to conductive features, e.g. plated holes, formed in the POL module 310. For example, a conduit, such as the feature 265 shown in FIG. 11 of the Panel Mold application, may be appropriately shaped and sized to provide a conductive receptacle for a conductive pin.

Underside Thermal Management

Figure 20A:
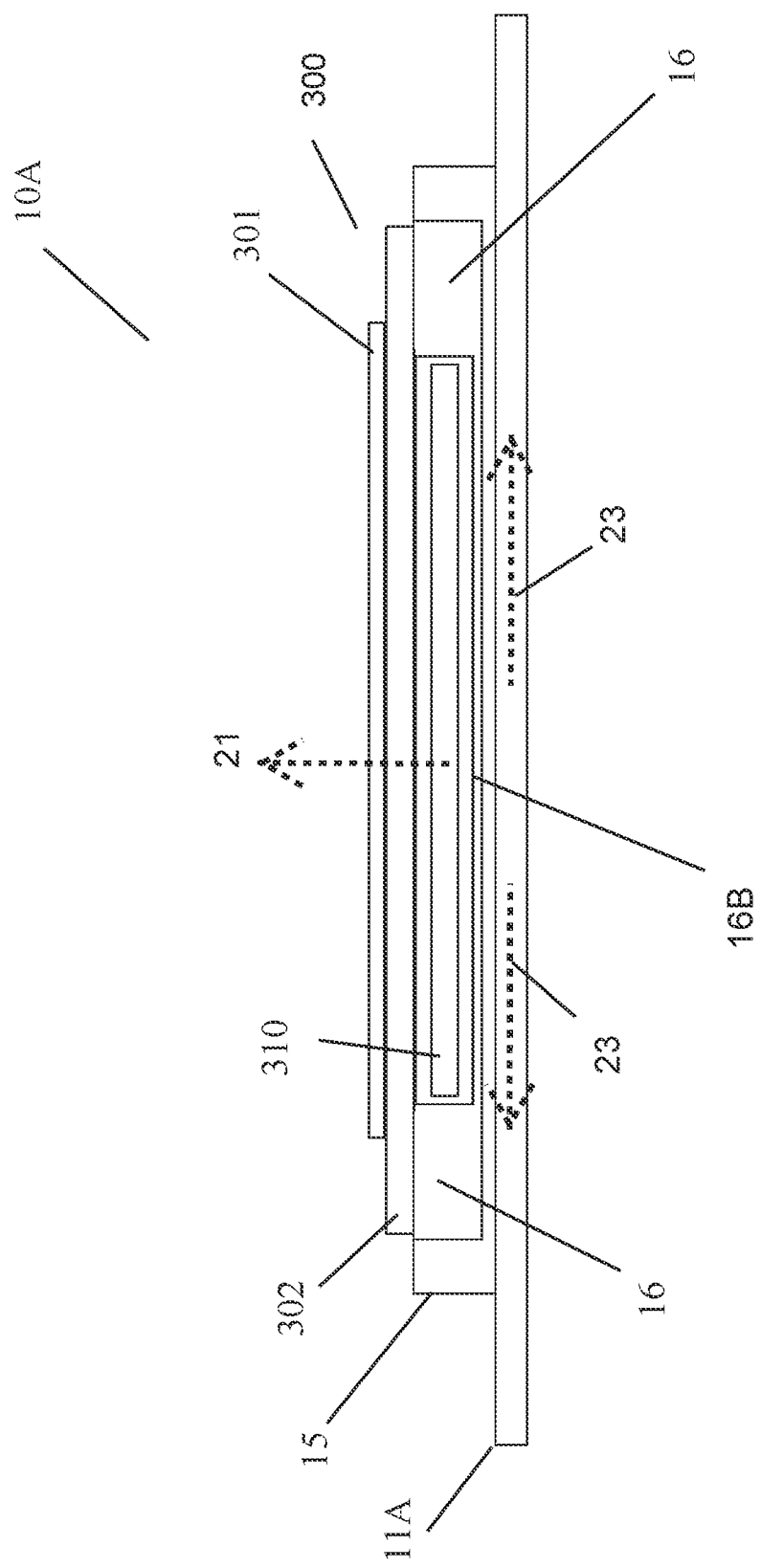
FIG. 20A and FIG. 20B show first and second mounting positions for the second and third semiconductor packages.

Referring to the side view of FIG. 20A, the package 300 may be assembled onto a surface of system board 11A using a socket 15 which may include contacts 16 for establishing electrical connections to the bottom surface 302B of the substrate. Heat may be conducted from the POL module 310 up through the substrate 302, e.g. through conductive features, 305, 307 and the connections there between, up through, and out the top of, the die 301, into a heat sink or lid (not shown) as represented by arrow 21 in FIG. 20A. Optionally, heat may be conducted away from the POL module through the system board 11A as represented by arrows 23 in FIG. 20A.

Figure 20B:
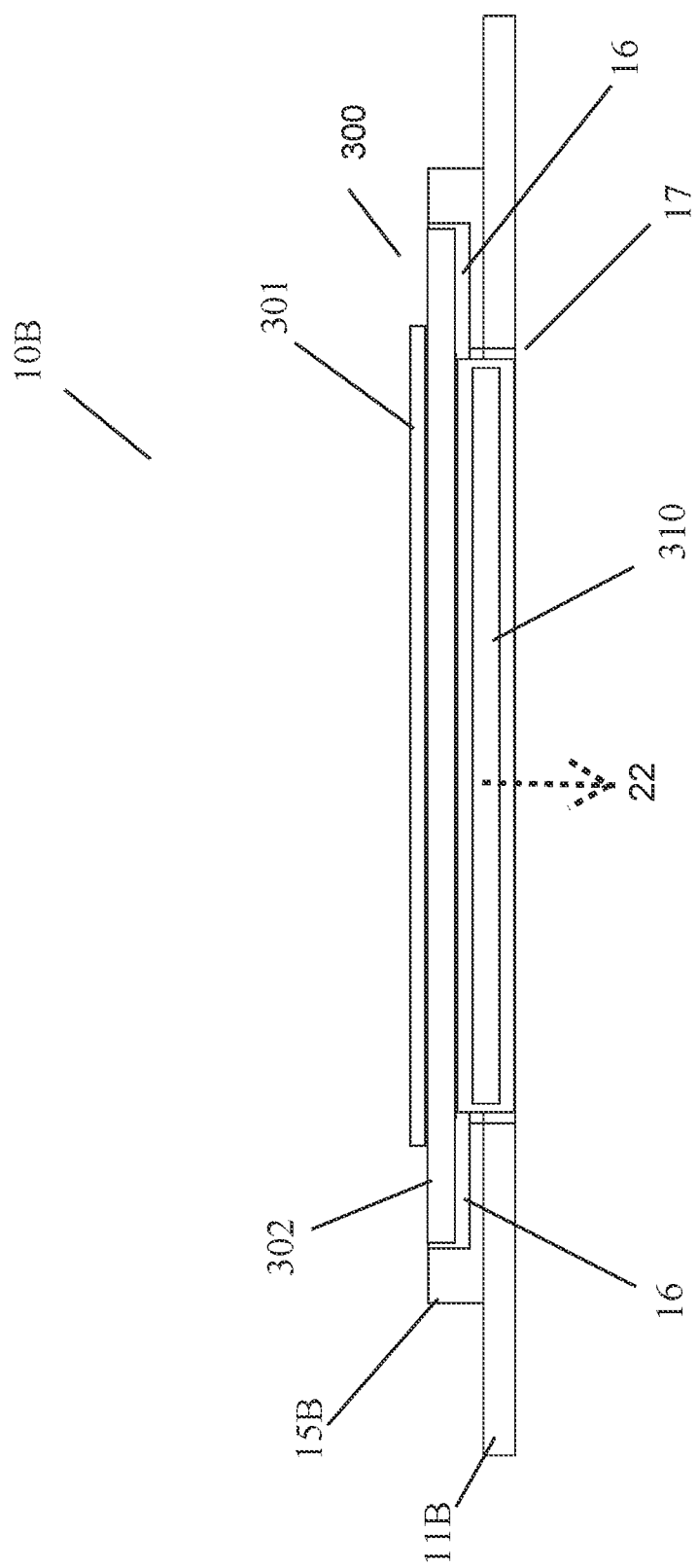

Referring to the side view of FIG. 20B, the package 300 may be assembled onto a surface of system board 11B using a low profile socket 15B having an aperture sized to accommodate the POL module 310 and contacts 16 for establishing electrical connections to the bottom surface 302B of the substrate. However, the system board 11B may include an aperture 17 sized to accommodate the POL module 310, providing a lower profile mounting alternative. In the embodiment of FIG. 20B, heat may be removed from the POL module 310 through the aperture 17 as represented by arrow 22, e.g. using forced air convection, a heat sink, or a cold plate (not shown).

A number of embodiments of the invention have been described. Nevertheless, it will be understood that various modifications may be made without departing from the spirit and scope of the invention. For example, a single resonant capacitor may be used instead of the two resonant capacitors shown in the symmetrical balanced circuit of FIG. 5 and FIG. 6. A center-tapped secondary circuit may be used in place of the full-bridge circuit shown. Although full-bridge driver circuits are shown in FIGS. 5, 6, and 9, a half-bridge primary circuit may be used to drive the power transformer. Although converter topologies having one, and two POL circuits have been shown, it will be appreciated that a larger number of POL circuits may be used. The POL outputs may be connected in parallel as shown to supply higher current loads, or independently for multiple loads. The POL circuits may be deployed within the semiconductor package or at locations near, or adjacent to the semiconductor package or other loads. The magnetically permeable fluid injected into the apertures 155 of the PCB 151 can include a powder with or without a curable medium. There can be two or more semiconductor chips mounted on the substrate 102, in which the semiconductor chips are all powered by the POL modules 110. The magnetically permeable fluid can be a liquid material.

Accordingly, other embodiments are within the scope of the following claims.

What is claimed is:

1. An apparatus comprising:
   a substrate having a plurality of interface connections connected to at least one surface of the substrate;
   a large-scale semiconductor device mounted to a top surface of the substrate;
   one or more switching power conversion circuits mounted to the top surface of the substrate, each switching power conversion circuit including at least one switch and an inductive component and being constructed and arranged to convert power from an input at an input voltage to an output at an output voltage for delivery to the large-scale semiconductor device, wherein a ratio of input voltage to output voltage of each switching power conversion circuit is fixed, subject to a series resistance, and is at least 5;
   wherein the one or more switching power conversion circuits are mounted laterally adjacent to one or more sides of the large-scale semiconductor device;
   an additional switching power conversion circuit mounted on a bottom surface of the substrate, the additional switching power conversion circuit including at least one switch and an inductive component and being constructed and arranged to convert power from an input at an input voltage to an output at an output voltage for delivery to the large-scale semiconductor device, wherein a ratio of input voltage to output voltage of the additional switching power conversion circuit is fixed, subject to a series resistance, and is at least 5;
   wherein the additional switching power conversion circuit is mounted within a footprint of the large-scale semiconductor device.

2. The apparatus of claim 1 wherein the substrate comprises a plurality of power connections extending vertically through the substrate from the top surface to the bottom surface, the vertical conductors being arranged with alternating polarities within a footprint of the large-scale semiconductor device to conduct power from the additional power conversion circuit to the large-scale semiconductor device.

3. The apparatus of claim 2 wherein the inductive component comprises a magnetically permeable core having an effective permeability of at least 25.

4. The apparatus of claim 2 wherein the inductive component further comprises a conductive shield.

5. The apparatus of claim 2, further comprising a switch controller configured and arranged to operate the respective switches of one or more of the switching power conversion circuits to limit slew rates of current in the one or more converters to less than or equal to 5*(Ipeak/Top), where Ipeak is the peak current and Top is the operating period of the one or more switching power conversion circuits.

6. The apparatus of claim 5, further comprising a driver circuit housed in a package that is separate from the one or more and additional switching power conversion circuits, the driver circuit having an input for receiving power from a source, circuitry adapted to drive the one or more and additional switching power conversion circuits, and a driver output for delivering power to the one or more and additional switching power conversion circuits via a power bus.

7. The apparatus of claim 5, wherein the switching power conversion circuits are configured and arranged to turn the at least one switch ON or OFF at essentially zero voltage.

8. The apparatus of claim 2, wherein the switching power conversion circuits are configured and arranged to turn the at least one switch ON or OFF at essentially zero current.

9. The apparatus of claim 1, further comprising a driver circuit separated by a distance from the one or more and additional switching power conversion circuits, the driver circuit having an input for receiving power from a source, circuitry adapted to drive the one or more switching power conversion circuits, and a driver output for delivering power to the one or more switching power conversion circuits via a power bus.

10. The apparatus of claim 1 further comprising a switch controller configured and arranged to operate the at least one switch of the switching power conversion circuit to limit slew rates of current in the one or more converters to less than or equal to 5*(Ipeak/Top), where Ipeak is the peak current and Top is the operating period of the one or more switching power conversion circuits.

11. The apparatus of claim 1 wherein the switching power conversion circuit is configured and arranged to convert power using a fixed transformation ratio K=Vout/Vin, subject to a series resistance, where Vout is the output voltage and Vin is the input voltage and K is less than or equal to 1/5.

12. The apparatus of claim 1 wherein the ratio of input voltage to output voltage is greater than or equal to 5.

13. The apparatus of claim 12 wherein the inductive component comprises a transformer having one or more windings formed in layers of a multi-layer printed circuit board ("PCB") and one or more magnetically permeable core pieces mounted to the PCB and power is converted from the input to the output via the transformer.

14. The apparatus of claim 13 wherein the at least one switch further comprises a plurality of secondary switches and the apparatus further comprising a switch controller configured and arranged to operate the at least one switch and the plurality of secondary switches.

15. The apparatus of claim 14 wherein the switch controller is constructed and arranged to operate the at least one switch and the secondary switches to turn ON at times when a voltage across the respective switch is essentially zero.

16. The apparatus of claim 15 wherein the switch controller is constructed and arranged to operate the secondary switches to turn OFF at times when a current through the respective switch is essentially zero.

17. The apparatus of claim 14, further comprising a driver circuit having an input for receiving power from a source, circuitry adapted to drive the one or more switching power conversion circuits, and a driver output for delivering power to the one or more switching power conversion circuits via a power bus.

18. The apparatus of claim 17 wherein the driver circuit is packaged as a self-contained assembly to be deployed separate from the one or more and additional switching power conversion circuits.

19. The apparatus of claim 18 wherein the driver circuit is separated by a distance from the one or more switching power conversion circuits.

20. The apparatus of claim 18, wherein the at least one switch is turned ON or OFF at times when a current through the at least one switch is essentially zero.

21. The apparatus of claim 18, wherein the switching power conversion circuits are configured and arranged to turn the at least one switch ON or OFF at essentially zero voltage.

22. The apparatus of claim 1 wherein the large-scale semiconductor device comprises two or more semiconductor chips.

23. The apparatus of claim 1 wherein the large-scale semiconductor device comprises one or more graphics processing units.

24. An apparatus comprising:
   a substrate having a plurality of interface connections connected to a surface of the substrate and a semiconductor device mounted to a top surface of the substrate, the interface connections being adapted for electrical connection to a system board;
   first and second top-side switching power conversion circuits mounted to the top surface of the substrate on opposite sides of the semiconductor device, each top-side switching power conversion circuit including at least one switch and an inductive component and being constructed and arranged to convert power from an input at an input voltage to an output at an output voltage for delivery to the semiconductor device;
   a bottom-side switching power conversion circuit mounted to the bottom surface of the substrate below the semiconductor device, the bottom-side switching power conversion circuit including at least one switch and an inductive component and being constructed and arranged to convert power from an input at an input voltage to an output at an output voltage for delivery to the semiconductor device;
   wherein the top-side and bottom side power conversion circuits supply power to the semiconductor device.

25. The apparatus of claim 24 wherein the substrate further comprises a plurality of power connections extending vertically through the substrate from the top surface to the bottom surface, the vertical conductors being arranged with alternating polarities within a footprint of the semiconductor device to conduct power from the bottom-side power conversion circuit to the semiconductor device.

26. The apparatus of claim 25 wherein the inductive component comprises a magnetically permeable core having an effective permeability of at least 25.

27. The apparatus of claim 26 wherein the inductive component further comprises a conductive shield.

28. The apparatus of claim 27, wherein the switching power conversion circuits are configured and arranged to turn the at least one switch ON or OFF at essentially zero current.

29. The apparatus of claim 27, wherein the switching power conversion circuits are configured and arranged to turn the at least one switch ON or OFF at essentially zero voltage.

30. The apparatus of claim 27 wherein the inductive component comprises a transformer having one or more windings formed in layers of a multi-layer printed circuit board ("PCB") and one or more magnetically permeable core pieces mounted to the PCB and power is converted from the input to the output via the transformer.

31. The apparatus of claim 24 wherein the semiconductor device comprises two or more semiconductor chips.

32. The apparatus of claim 24 wherein the semiconductor device comprises one or more graphics processing units.

33. The apparatus of claim 32 further comprising a switch controller configured and arranged to operate the at least one switch of the switching power conversion circuit to limit slew rates of current in the one or more converters to less than or equal to 5*(Ipeak/Top), where Ipeak is the peak current and Top is the operating period of the switching power conversion circuit.

34. The apparatus of claim 32 further comprising a switch controller configured and arranged to operate the at least one switch of the switching power conversion circuit to turn the at least one switch ON at times when a voltage across the at least one switch is essentially zero.

35. The apparatus of claim 32 further comprising a switch controller configured and arranged to operate the at least one switch of the switching power conversion circuit to turn the at least one switch OFF at times when a current through the at least one switch is essentially zero.

36. The apparatus of claim 35, wherein the at least one switch is turned ON or OFF at times when a current through the at least one switch is essentially zero.

37. The apparatus of claim 32, further comprising a driver circuit located outside the semiconductor package having an input for receiving power from a source, circuitry adapted to drive the one or more switching power conversion circuits, and a driver output for delivering power to the one or more switching power conversion circuits via a power bus.

38. The apparatus of claim 37, wherein the switching power conversion circuits are configured and arranged to turn the at least one switch ON or OFF at essentially zero voltage.

39. The apparatus of claim 24 further comprising lateral power connections electrically connected to outputs of the first and second top-side switching power conversion circuits, the lateral power connections being constructed and arranged to carry power from the outputs of the first and second top-side switching power conversion circuits laterally to the large-scale semiconductor device.

40. The apparatus of claim 39 wherein the large-scale semiconductor device includes a high-power rail for receiving input power at a first voltage and the lateral power connections carry power from the outputs of the first and second top-side switching power conversion circuits laterally to the high-power rail of the large-scale semiconductor device.

41. The apparatus of claim 39 wherein a plurality of power connections extending vertically through the substrate from the top surface to the bottom surface carry power from the output of the bottom-side switching power conversion circuit vertically to a high-power rail of the large-scale semiconductor device.

42. The apparatus of claim 39 wherein the lateral power connections carry power from the outputs of the first and second top-side switching power conversion circuits laterally to a high-power rail of the large-scale semiconductor device and the plurality of power connections extending vertically through the substrate from the top surface to the bottom surface carry power from the output of the bottom-side switching power conversion circuit vertically to the high-power rail of the large-scale semiconductor device.

43. An apparatus comprising:
a substrate having a plurality of interface connections connected to at least one surface of the substrate and a large-scale semiconductor device mounted to a top surface of the substrate, the interface connections being adapted for electrical connection to a system board;
a switching power conversion circuit mounted to a bottom surface of the substrate, the switching power conversion circuit including at least one switch and an inductive component and being constructed and arranged to convert power from an input at an input voltage to an output at an output voltage for delivery to the large-scale semiconductor device;
wherein the switching power conversion circuit is mounted within a footprint of a selected one of the large-scale semiconductor device;
wherein the substrate comprises a plurality of power connections extending vertically through the substrate from the top surface to the bottom surface, the vertical conductors being arranged with alternating polarities within a footprint of the semiconductor device to conduct power from the switching power conversion circuit to the large-scale semiconductor device.

44. The apparatus of claim 43 further comprising a switch controller configured and arranged to operate the at least one switch of the switching power conversion circuit to limit slew rates of current in the one or more converters to less than or equal to 5*(Ipeak/Top), where Ipeak is the peak current and Top is the operating period of the one or more switching power conversion circuits.

45. The apparatus of claim 43 wherein the switching power conversion circuit is configured and arranged to convert power using a fixed transformation ratio K=Vout/Vin, subject to a series resistance, where Vout is the output voltage and Vin is the input voltage and K is less than or equal to 1/5.

46. The apparatus of claim 43 wherein the ratio of input voltage to output voltage is greater than or equal to 5.

47. The apparatus of claim 43 wherein the inductive component comprises a transformer and power is converted from the input to the output via the transformer.

48. The apparatus of claim 43, wherein the large-scale semiconductor device comprises two or more semiconductor chips.

49. The apparatus of claim 43, wherein the large-scale semiconductor device comprises one or more graphics processing units.

50. An apparatus comprising:
a substrate having a plurality of interface connections connected to at least one surface of the substrate;
a large-scale semiconductor device mounted to a top surface of the substrate;

one or more switching power conversion circuits mounted to the top surface of the substrate laterally adjacent to one or more sides of the large-scale semiconductor device, each switching power conversion circuit including at least one switch and an inductive component and being constructed and arranged to convert power from an input at an input voltage to an output at an output voltage for delivery to the semiconductor device, wherein a ratio of input voltage to output voltage of each switching power conversion circuit is at least 5;

an additional switching power conversion circuit mounted to a bottom surface of the substrate within, or substantially within, a footprint of the large-scale semiconductor device, the additional switching power conversion circuit including at least one switch and an inductive component and being constructed and arranged to convert power from an input at an input voltage to an output at an output voltage for delivery to the semiconductor device, wherein a ratio of input voltage to output voltage of the additional switching power conversion circuit is at least 5; and the substrate comprises a plurality of vertical power connections extending vertically through the substrate from the top surface to the bottom surface, the vertical power connections being arranged with alternating polarities within a footprint of the semiconductor device to conduct power from the additional switching power conversion circuit to the large-scale semiconductor device.

51. The apparatus of claim 50 wherein the inductive component of the additional switching power conversion circuit comprises a magnetically permeable core having an effective permeability of at least 25.

52. The apparatus of claim 50 wherein the inductive component of the additional switching power conversion circuit further comprises a conductive shield.

53. The apparatus of claim 50, wherein the switching power conversion circuits are configured and arranged to turn the at least one switch ON or OFF at essentially zero current.

54. The apparatus of claim 50, wherein the switching power conversion circuits are configured and arranged to turn the at least one switch ON or OFF at essentially zero voltage.

55. The apparatus of claim 50 wherein the inductive component of at least one of the one or more and additional switching power conversion circuits comprises a transformer having one or more windings formed in layers of a multi-layer printed circuit board ("PCB") and one or more magnetically permeable core pieces mounted to the PCB and power is converted from the input to the output via the transformer.

56. The apparatus of claim 55 wherein at least one of the one or more and additional switching power conversion circuits further comprises a rectification circuit connected to the second winding for rectifying power received from the transformer; and an output connected to the rectification circuit for supplying DC power to the large-scale semiconductor device.

57. The apparatus of claim 50 wherein the inductive component of the additional switching power conversion circuit further comprises a conductive shield.

58. The apparatus of claim 50, wherein the large-scale semiconductor device comprises two or more semiconductor chips.

59. The apparatus of claim 50, wherein the large-scale semiconductor device comprises one or more graphics processing units.

60. An apparatus comprising:

a substrate having a plurality of interface connections connected to at least one surface of the substrate;

a large-scale semiconductor device mounted to a top surface of the substrate, the large-scale semiconductor device having a high-power rail for receiving input power at a first voltage;

one or more switching power conversion circuits mounted to the top surface of the substrate laterally adjacent to one or more sides of the large-scale semiconductor device, each switching power conversion circuit including at least one switch and an inductive component and being constructed and arranged to convert power from an input at an input voltage to an output at an output voltage, wherein the input voltage is greater than the output voltage;

an additional switching power conversion circuit mounted on a bottom surface of the substrate within at least a portion of a footprint of the large-scale semiconductor device, the additional switching power conversion circuit including at least one switch and an inductive component and being constructed and arranged to convert power from an input at an input voltage to an output at an output voltage for delivery to the high-power rail of the large-scale semiconductor device at the first voltage, wherein the input voltage is greater than the output voltage of the additional switching power conversion circuit;

the substrate including a plurality of vertical power connections extending vertically through the substrate from the top surface to the bottom surface, the vertical power connections being arranged with alternating polarities within a footprint of the large-scale semiconductor device to conduct power from the additional switching power conversion circuit to the high-power rail of the large-scale semiconductor device.

61. The apparatus of claim 60 wherein the inductive component further comprises a conductive shield.

62. The apparatus of claim 60 wherein the additional power conversion circuit occupies at least half of the footprint.

63. The apparatus of claim 60 wherein the additional power conversion circuit occupies substantially all of the footprint.

64. The apparatus of claim 60 wherein the one or more switching power conversion circuits and the additional switching power conversion circuit each have an output connected to supply power to the high power rail at the first voltage.

65. The apparatus of claim 60 wherein the large-scale semiconductor device receives power exclusively from selected ones of the additional switching power conversion circuit and the one or more switching power conversion circuits.

66. The apparatus of claim 60 wherein the large-scale semiconductor device comprises a GPU or CPU.

67. The apparatus of claim 60 further comprising lateral power connections electrically connected to one or more outputs of the one or more switching power conversion circuits mounted to the top surface, the lateral power connections being constructed and arranged to carry power from the one or more outputs of the one or more switching power conversion circuits laterally parallel to the top or bottom surface of the substrate.

68. The apparatus of claim 60 further comprising lateral power connections electrically connected to output of the one or more switching power conversion circuits mounted to the top surface, the lateral power connections being constructed and arranged to carry power from the output of the one or more switching power conversion circuits laterally to the large-scale semiconductor device.

69. The apparatus of claim 68 wherein the large-scale semiconductor device includes a high-power rail for receiving input power at a first voltage and the lateral power connections carry power from the output of the one or more switching power conversion circuits laterally to the high-power rail of the large-scale semiconductor device.

70. The apparatus of claim 68 wherein the plurality of power connections extending vertically through the substrate from the top surface to the bottom surface carry power from the output of the additional switching power conversion circuit vertically to the high-power rail of the large-scale semiconductor device.

71. The apparatus of claim 68 wherein the lateral power connections carry power from the output of the one or more switching power conversion circuits laterally to the high-power rail of the large-scale semiconductor device and the plurality of power connections extending vertically through the substrate from the top surface to the bottom surface carry power from the output of the additional switching power conversion circuit vertically to the high-power rail of the large-scale semiconductor device.

* * * * *

UNITED STATES PATENT AND TRADEMARK OFFICE
CERTIFICATE OF CORRECTION

| | | |
|---|---|---|
| PATENT NO. | : 11,876,520 B1 | Page 1 of 1 |
| APPLICATION NO. | : 17/390285 | |
| DATED | : January 16, 2024 | |
| INVENTOR(S) | : Patrizio Vinciarelli and Andrew T. D'Amico | |

It is certified that error appears in the above-identified patent and that said Letters Patent is hereby corrected as shown below:

In the Specification

Column 13, Line 3, after "by" delete "reference)".

Column 15, Line 59, delete "FIG." and insert -- FIGS. --.

Signed and Sealed this
Fifteenth Day of October, 2024

Katherine Kelly Vidal
*Director of the United States Patent and Trademark Office*